(12) United States Patent
Hata

(10) Patent No.: US 7,226,705 B2
(45) Date of Patent: Jun. 5, 2007

(54) METHOD OF MANUFACTURING A MASK BLANK AND A MASK, THE MASK BLANK AND THE MASK, AND USELESS FILM REMOVING METHOD AND APPARATUS

(75) Inventor: Mitsuaki Hata, Tokyo (JP)

(73) Assignee: Hoya Corporation, Tokyo (JP)

( * ) Notice: Subject to any disclaimer, the term of this patent is extended or adjusted under 35 U.S.C. 154(b) by 65 days.

(21) Appl. No.: 10/255,706

(22) Filed: Sep. 27, 2002

(65) Prior Publication Data

US 2003/0077523 A1     Apr. 24, 2003

(30) Foreign Application Priority Data

Sep. 28, 2001  (JP) ............................. 2001-299748

(51) Int. Cl.
  *G03F 1/00*    (2006.01)
  *G03C 5/00*    (2006.01)
(52) U.S. Cl. ......................... 430/5; 430/313; 430/329
(58) Field of Classification Search ................. 430/5, 430/313, 329
   See application file for complete search history.

(56) References Cited

U.S. PATENT DOCUMENTS

| 6,245,466 | B1 * | 6/2001 | Kotani et al. | 430/5 |
| 6,710,847 | B1 * | 3/2004 | Irie | 430/5 |
| 6,733,686 | B2 * | 5/2004 | Hata | 216/91 |
| 2002/0000424 | A1 | 1/2002 | Hata | |

FOREIGN PATENT DOCUMENTS

| JP | 58-7144 U | 1/1983 |
| JP | 58-19350 | 4/1983 |
| JP | 58-88239 U | 6/1983 |
| JP | 60-50450 U | 4/1985 |
| JP | 62-41145 U | 3/1987 |
| JP | 1-173717 | 7/1989 |
| JP | 1-173718 | 7/1989 |
| JP | 5-166709 | 7/1993 |
| JP | 6-262124 A | 9/1994 |
| JP | 7-20623 A | 1/1995 |
| JP | 2910867 | 4/1999 |
| JP | 2001-179163 A | 7/2001 |
| JP | 2001-259502 | 9/2001 |
| JP | 2001-259502 A | 9/2001 |
| WO | WO 00/28380 A1 | 5/2000 |

* cited by examiner

*Primary Examiner*—Geraldina Visconti
(74) *Attorney, Agent, or Firm*—Sughrue Mion, PLLC

(57) ABSTRACT

In a method of removing a useless film formed along a circumferential portion of a substrate, so as to provide a removed portion, a cover member is covered over the substrate to supply a solvent to the useless portion through solvent supply holes. The circumferential portion which has the removed portion and a non-removed portion serves to provide an identification code or the like for identifying the substrate. The solvent supply holes are formed in a solvent guide member which is exchangeably attached to a peripheral portion of the cover member. The substrate may be either a mask blank or a mask that has the identification pattern formed by removing the useless film by the above-mentioned method.

20 Claims, 11 Drawing Sheets

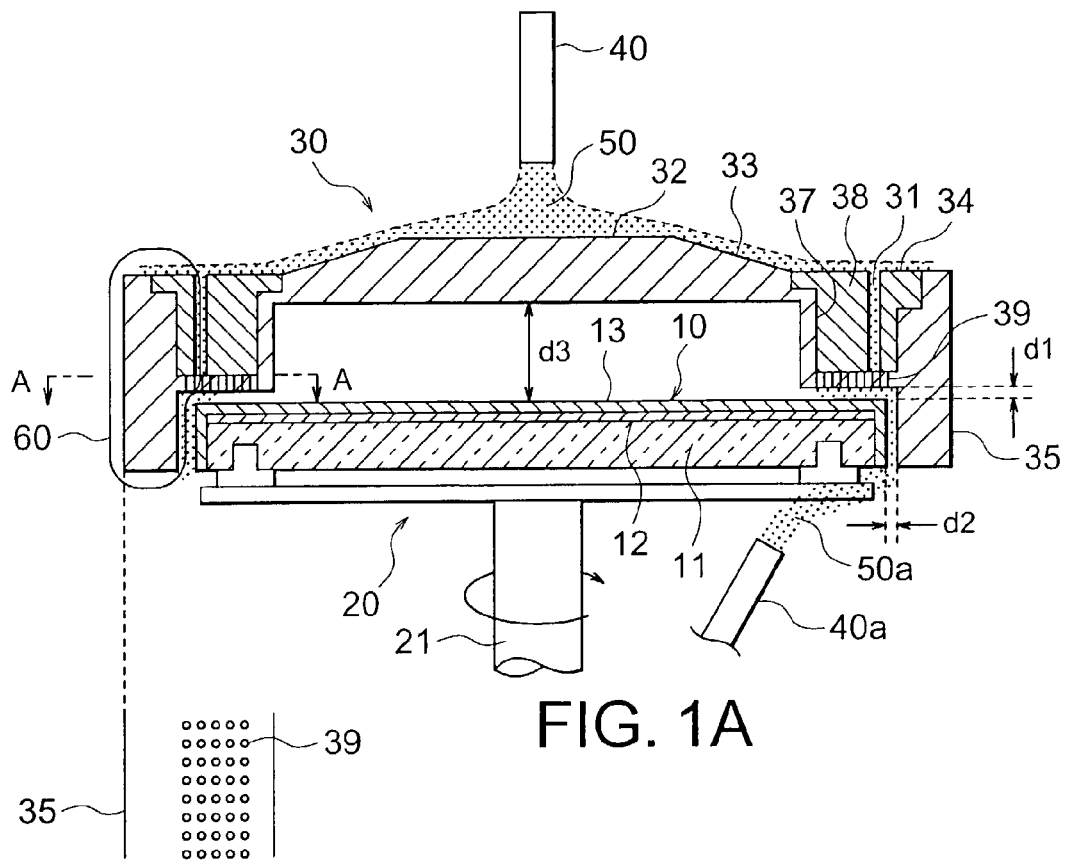
FIG. 1A
FIG. 1B
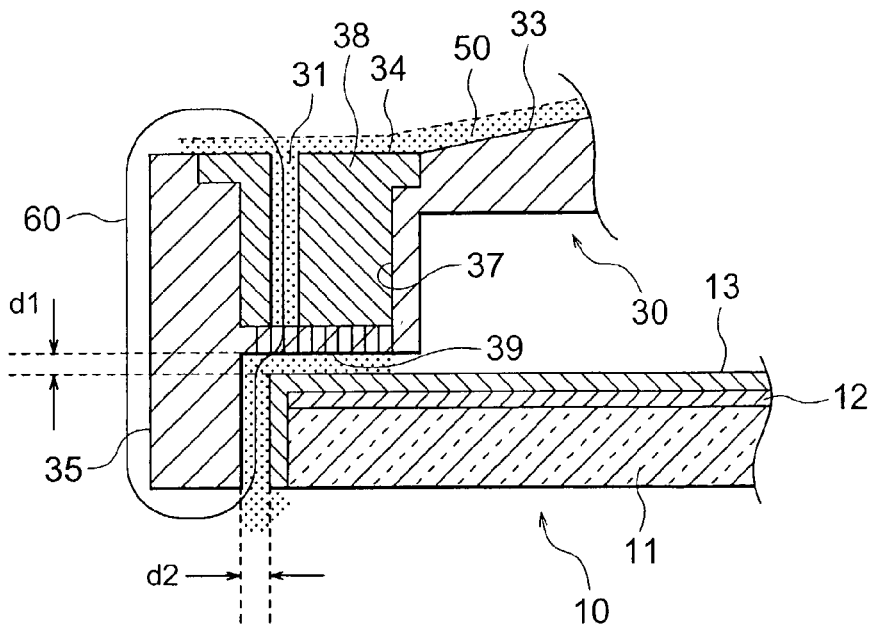
FIG. 2

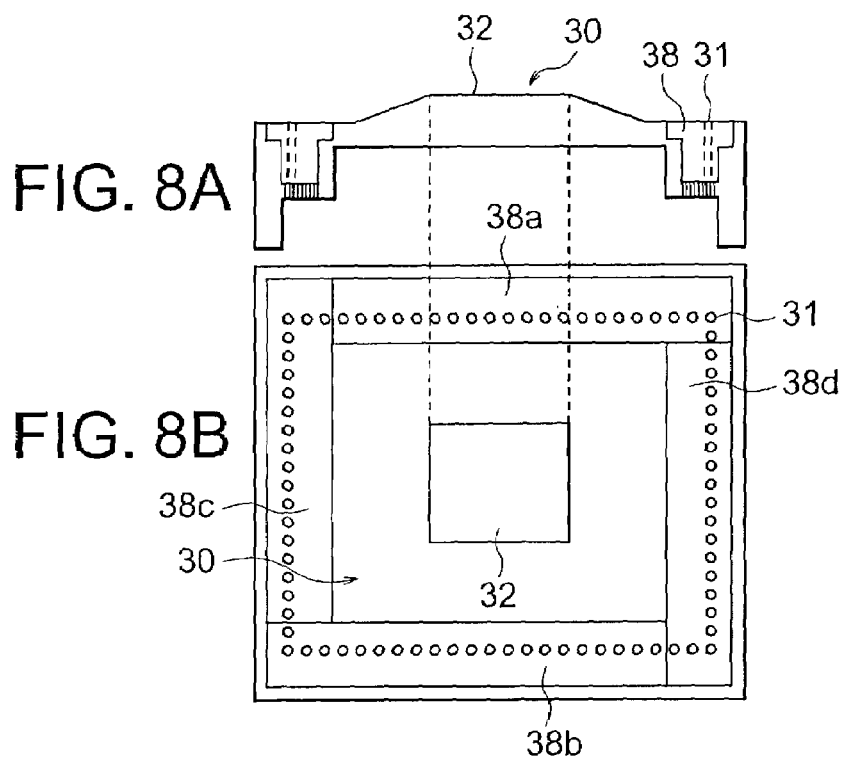
FIG. 8A
FIG. 8B
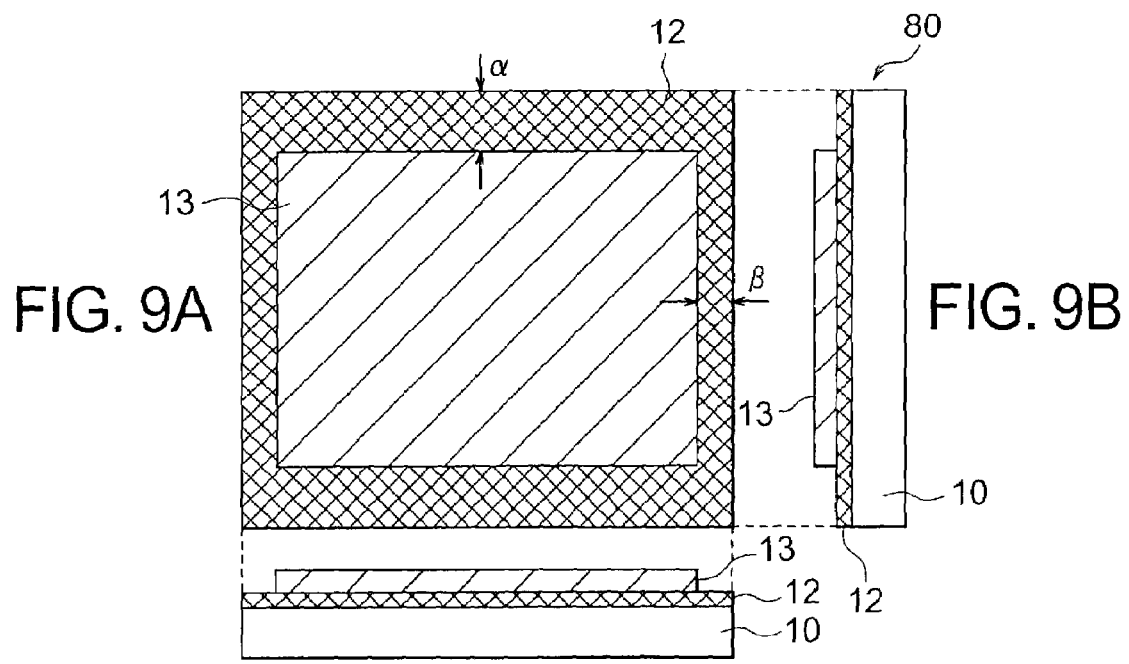
FIG. 9A
FIG. 9B
FIG. 9C

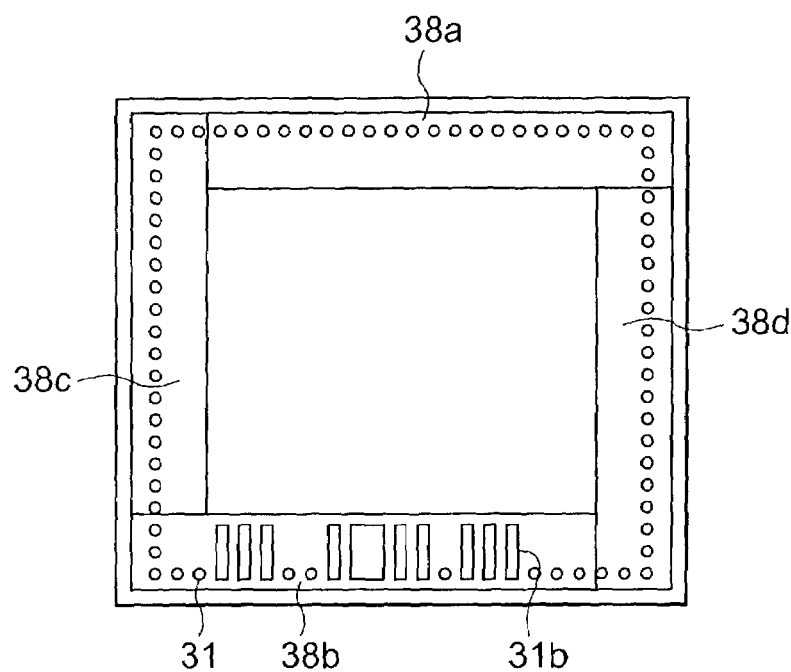
FIG. 10
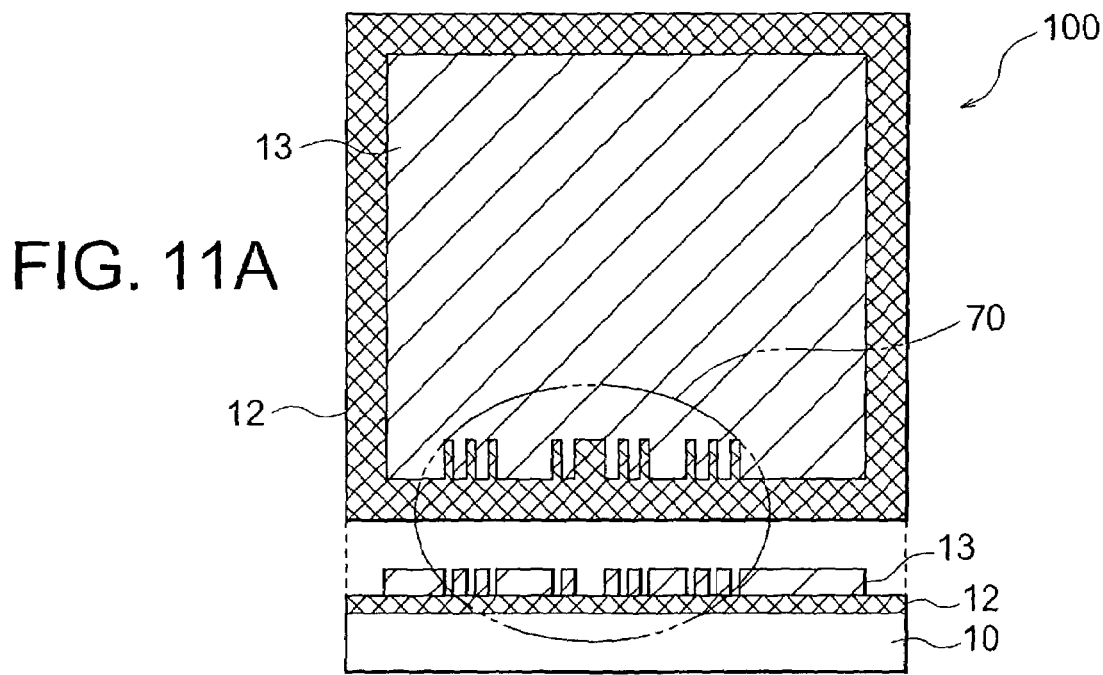
FIG. 11A
FIG. 11B

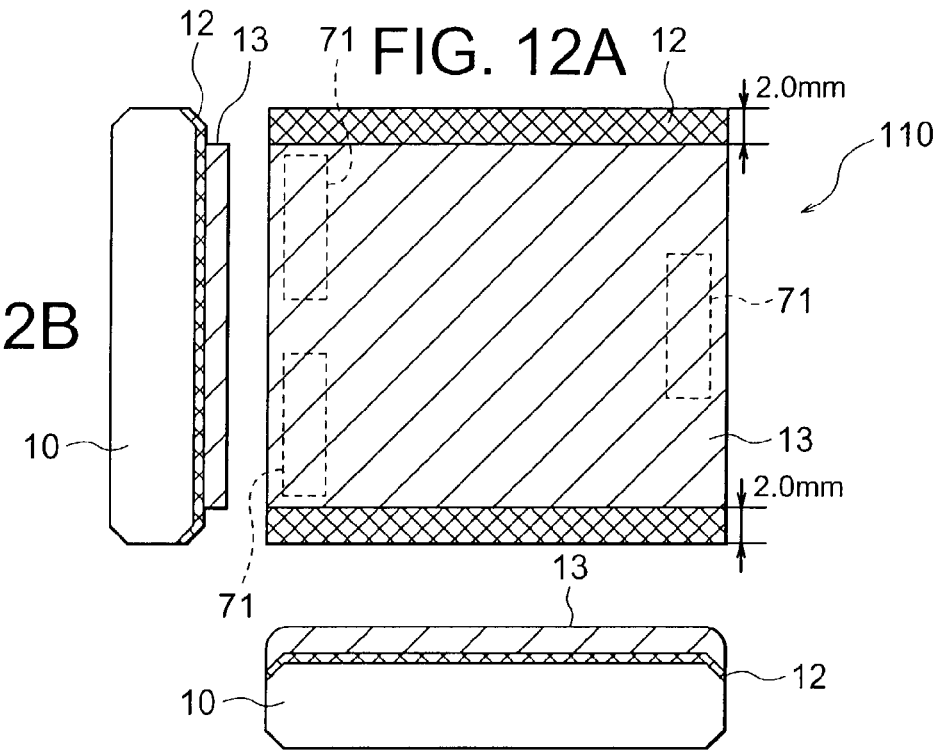
FIG. 12A
FIG. 12B
FIG. 12C
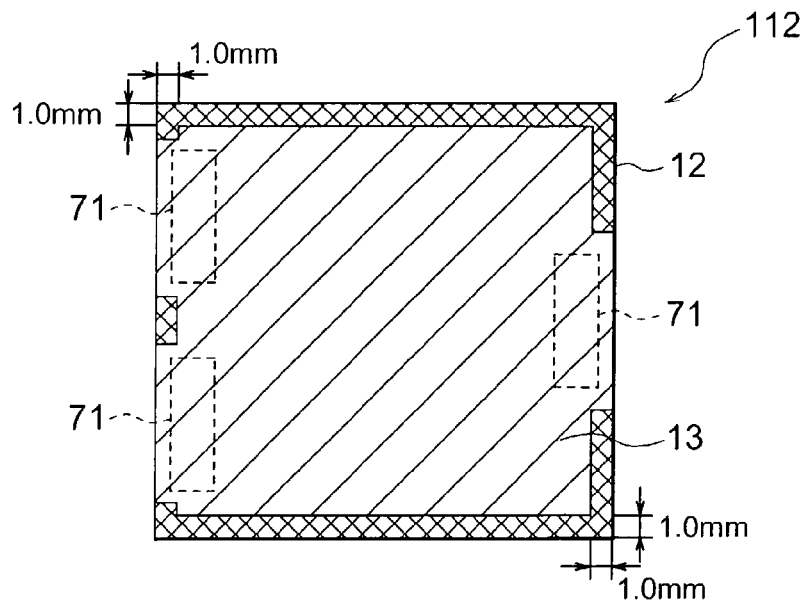
FIG. 13

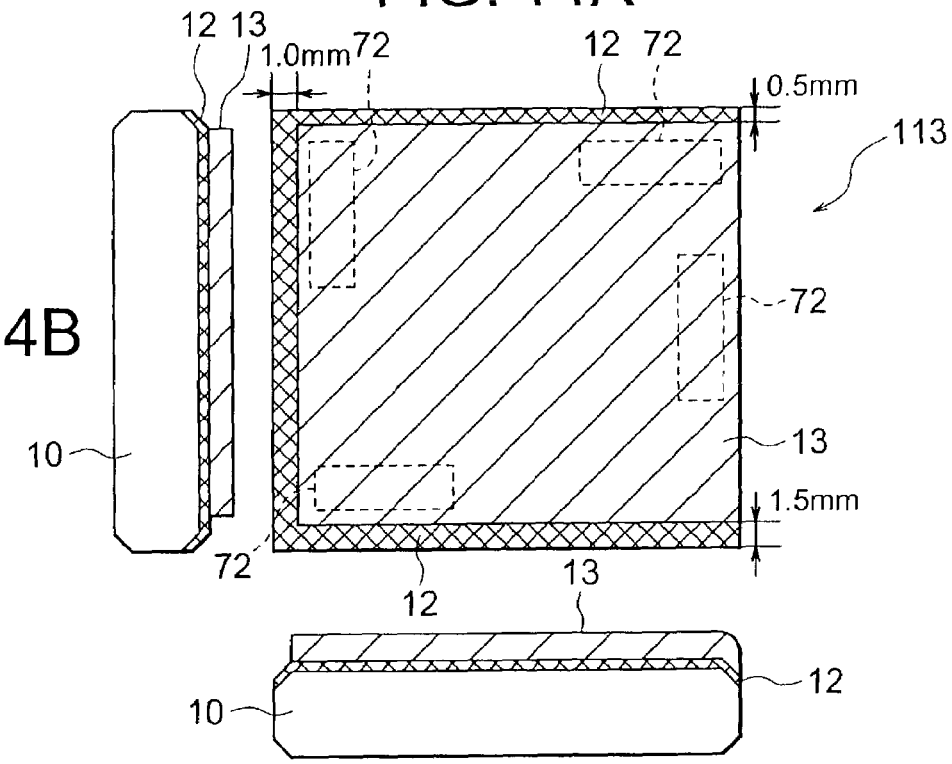
FIG. 14A
FIG. 14B
FIG. 14C
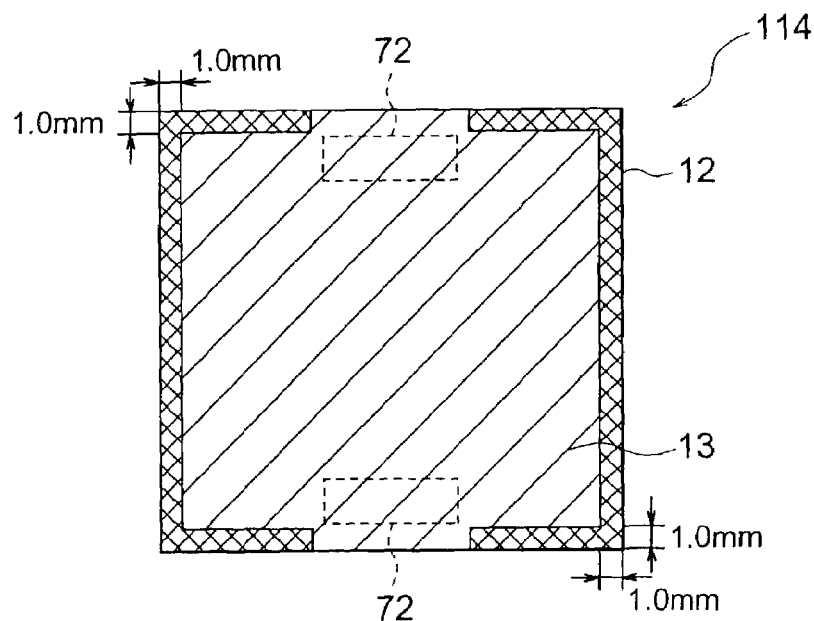
FIG. 15

METHOD OF MANUFACTURING A MASK BLANK AND A MASK, THE MASK BLANK AND THE MASK, AND USELESS FILM REMOVING METHOD AND APPARATUS

BACKGROUND OF THE INVENTION

This invention relates to a mask blank which is used in a lithography process on fabricating a semiconductor device or the like and a method of manufacturing the mask blank. In addition, this invention also relates to a method of removing a useless film partially left on a surface of a substrate, such as a semiconductor substrate, and a removing apparatus for carrying out the method. Although the term "useless" will be mainly used in the instant specification, the term "unnecessary" may be used instead of the term "useless".

In a field of manufacturing a semiconductor device, mask blank, and the like, it is often required to partially remove a useless portion from a film deposited on a principal surface of a substrate.

For example, let consideration be made about coating a resist film or a spin on glass (SOG) film on the substrate by a spin coat method. In this event, the substrate that is substantially kept horizontal is rotated. Under the circumstances, a coating agent or liquid is dripped on the substrate and is spread on the principal surface by centrifugal force to form a coated film on the principal surface. Herein, it is to be noted that, when the substrate is rotated at a slow speed so that a uniform film is coated on a whole of the principal surface, the centrifugal force becomes weak at a peripheral portion of the substrate and the coating liquid is undesirably left at the peripheral portion. As a result, the coated film is thick at the peripheral portion to form a hump thereat. Such a hump at the peripheral portion gives rise to the following problems when a resist is used as the coating liquid.

In a manufacturing process of a mask blank, such as a photo-mask blank, each substrate with the resist film is subjected to various processes and is often grasped by a transfer mechanism and/or is entered in or out of a substrate cassette during the processes. In this event, the peripheral portion of the substrate is brought into contact with a chuck of the transfer mechanism and with a slot or recess of the cassette. Such contacts bring about peeling off the resist film at the peripheral portion. Peeled off resist acts as a dust source and adheres to the principal surface of the mask blank and, as a result, causes an undesired defect to occur on the mask blank.

Taking the above into account, processing is often adopted such that the resist film is previously removed from the peripheral portion after the resist film is coated by the spin coating method. Such processing is carried out by horizontally rotating the substrate with the resist film around a rotation axis, by supplying a solution liquid of dissolving the resist onto the peripheral portion, and by removing the resist film from the peripheral portion.

Such a method is exemplified in Japanese Patent Publication JP 58-19350 B2, namely, 19350/1983. The disclosed method is carried out by placing a hollow cover of a pyramidal configuration on a substrate surface and by supplying a solvent from an apex onto the peripheral portion of the substrate.

In the meantime, it is a recent trend that a mask blank, especially, a photo-mask blank becomes large in size, for example, from a substrate size of 5×5 (inches) to 6×6 (inches). As the substrate becomes large in size, its weight becomes heavy. This impertinently heightens a possibility of occurrence of dust due to contacts between the peripheral portion of the substrate and a mask case, when the substrate with the resist film is introduced into the mask case. In this viewpoint also, requirements have been directed to removing the resist film coated at the peripheral portion.

Moreover, it often happens that supplementary patterns, such as alignment marks, barcode patterns, quality assurance (QA) patterns, and the like are arranged on a mask substrate except real patterns. The supplementary patterns tend to be located at an area very close to a peripheral edge of the substrate with an expansion of an effective area for the real pattern.

Now, description will be made about shortcomings of the conventional method mentioned in the above.

(1) The resist film can be removed along four sides of the photo-mask blank only in a constant removed width that is comparatively wide. The resist film is removed until an area of forming the supplementary patterns, which renders the supplementary patterns defective.

(2) The photo-mask blank is processed by a photolithography technique into a reticle for delineating a fine pattern on a semiconductor wafer by the use of an exposure device. In this event, the reticle is fastened or chucked by a reticle chuck prepared in the exposure device. Herein, it is to be noted that the reticle chuck is different in structure from one another at every maker for the exposure device. At any rate, the reticle is held on a substrate table in each exposure device with the reticle adsorbed by the reticle chuck, so as to avoid displacement of the reticle. Specifically, the reticle is supported with three points adsorbed by the reticle chuck because a plane can be defined by three points. The three adsorbed points should not be displaced because accuracy of position in the exposure device is very important so as to form a fine pattern on a semiconductor wafer. However, the resist film can not be removed in consideration of a configuration of the reticle chuck and accuracy of the position is inevitably deteriorated in the exposure device.

(3) With a short wavelength of exposure light, recent requirements have been directed to a mask blank of a high quality having a small number of defects. Under the circumstances, a plurality of mask blanks (usually 5 in number) are accommodated or packaged into a mask case for shipment. In this event, each of the mask blanks should be identified in the mask case so as to distinguish them from one another. To this end, the mask case is usually given defect degree data of each mask blank packaged in the mask case. The defect degree data on each mask blank should be collated with reference to each position of the mask blanks packaged in the mask case. However, collation of the defect degree data becomes difficult once each mask blank is picked out of the mask case to be investigated and is placed into a different position of the mask case. In this case, defects of the mask blanks in the mask case should be measured again.

(4) An area of forming supplementary patterns, such as alignment marks, is usually different in specification at every mask manufacturer. In this event, the alignment marks can not be often formed when the same cover is used to remove the useless portions by partially dissolving the resist film. This is because using the same cover brings about undesirably removing the peripheral portions of the mask substrate to positions of forming the alignment marks.

In order to avoid such undesirable removal of the resist film, considerations may be made about designing and preparing covers that provide alignment marks different from one another at every mask manufacturer. However, this drives up costs and requires troublesome replacement of the covers and laborious maintenance.

SUMMARY OF THE INVENTION

It is an object of this invention to provide a mask blank which can suppress occurrence of dust resulting from separation of a resist film on a substrate peripheral portion and which desirably forms a removed area suitable for supplementary patterns along a peripheral or circumferential portion.

It is another object of this invention to provide a mask blank which can suppress occurrence of dust resulting from separation of a resist film on a substrate peripheral portion and which has a removed area of the resist film formed along a circumferential or peripheral area corresponding to a substrate support member of an exposure device.

It is still another object of this invention to provide a mask blank which forms identification patterns, such as defect degree data patterns of the mask blank.

It is yet another object of this invention to provide a mask, such as a photo-mask, which has a reduced number of pattern defects of identification patterns and a mask, such as a reticle, which is not reduced in accuracy of positions when it is held by an exposure device.

It is another object of this invention to provide a method of manufacturing the above-mentioned mask blank and/or mask, which can pertinently control a removed portion formed along a substrate peripheral area.

It is an object of this invention to provide a useless portion removing apparatus which can pertinently control or adjust a removed area so as to obtain the above-mentioned mask blank.

According to a first aspect of this invention, a mask blank is used as an original plate of a transfer mask having a transfer pattern on a substrate and comprises:

a thin film for providing the transfer pattern on the substrate; and a resist film having a circumferential portion which is left on the substrate at a support area to be supported by a holder used in an exposure apparatus and its peripheral area and that is removed from any other areas than the support and the peripheral areas.

According to a second aspect of this invention, a mask blank is used as an original plate of a transfer mask having a transfer pattern on a substrate and comprises:

a thin film for providing the transfer pattern and a supplementary pattern on the substrate;

a resist film having a circumferential portion that is left on the substrate at a supplementary pattern area for the supplementary pattern and its peripheral area and that is removed from any other useless area than the supplementary pattern area and its peripheral area.

According to a third aspect of this invention, a mask blank which is used as an original plate of a transfer mask having a transfer pattern on a substrate and comprises:

a thin film for providing the transfer pattern on the substrate; and an additional film, such as a resist film. The additional film has a circumferential portion which is left on a substrate peripheral portion and which is partially removed to form an identification pattern to identify the mask blank. According to a fourth aspect of this invention, the identification pattern of the mask blank according to the third aspect of this invention is specified by a barcode pattern.

According to a fifth aspect of this invention, the additional film of the mask blank according to the third or the fourth aspect is composed of a resist film.

According to a sixth aspect of this invention, the resist film of the mask blank according to the fifth aspect is left only at an area of the identification pattern with the remaining area removed from the substrate circumferential portion.

According to a seventh aspect of this invention, the mask blank according to the first aspect is a photo-mask blank which comprises a transparent substrate, a light shielding film for shielding light, and a resist film.

According to the first through the seventh aspects of this invention, it is possible to provide the mask blank which can solve the above-mentioned problems of the conventional technology.

More particularly, description will be made about the first through the sixth aspects that can solve the problems. According to the first aspect, the mask blank which may be, for example, a photo-mask blank, has the film (resist film) removed so that it is left on the support area and its peripheral area or an adjacent area to the support area. The support area is to be supported by the holder of the exposure device. In other words, the resist film remains on the support area and its peripheral and/or adjacent area and is removed from any other areas of the circumferential portion than the above-mentioned areas. With this structure, it is possible to prevent accuracy of position from being reduced in the exposure device when the above-mentioned mask blank is processed into a reticle by patterning the mask blank by a photolithography technique.

According to the second aspect, the resist film is removed so that it is left on at least the area for forming the supplementary pattern. Stated otherwise, the resist film is left on the supplementary pattern area for forming the supplementary pattern and its peripheral area and is removed from the areas except the above-mentioned areas. Therefore, a pattern defect can be reduced on the supplementary pattern area for the supplementary pattern, such as the alignment pattern, on manufacturing a mask.

According to the third and the fourth aspects, the identification pattern and the barcode pattern can be directly formed on the mask blank. This shows that a mask blank specification, a product number, a lot number, and the like can be attached to each mask blank itself. The identification pattern and the barcode pattern can readily be etched out by etching on manufacturing a mask, if they are unnecessary. Pattern recognition can be made by using the identification and the barcode patterns. Specifically, the identification and the barcode patterns can be recognized by utilizing reflection from the light shielding film underlying the resist film partially removed or by utilizing reflection from a transparent substrate and films formed by the resist film/the light shielding film obtained by etching the light shielding film by using the resist film as a mask.

According to the fifth aspect, the resist film is formed along the circumferential portion on a substrate principal surface. Such a resist film can be readily etched out on manufacturing the mask, which serves to reduce a defect factor on manufacturing the mask.

According to the sixth aspect, the resist film is removed from the circumferential portion only with the identification pattern left. This structure is effective to suppress occurrence of dust resulting from the separation of the resist film formed along the circumferential portion of the substrate.

The identification pattern and the barcode pattern formed along the circumferential portion on manufacturing the mask may be formed on etching the resist film and/or the light shielding film by a laser beam.

In addition, the mask blank according to this invention may be a transparent type mask blank or a reflection type mask blank and, at any rate, may have, on the substrate, the transfer pattern to be transferred and the resist film. Herein, the transparent type mask blank has a transparent substrate as the substrate, and a film of the transfer pattern that causes an optical variation or change (for example, a light shielding effect) to occur on optically transferring a pattern due to exposure light. Specifically, the film that causes the optical variation to occur may include a light shielding film for shielding the exposure light or a phase shift film for changing a phase of the exposure light. The light shielding film that has a light shielding function may be formed by a stacked film (for example, a multi-layered light shielding film) In addition, the light shielding film may be formed by a thin film having a light shielding function and may include so-called a half-tone film having functions of shielding and phase-shifting the exposure light and a light shielding film for shielding the exposure light.

Accordingly, the mask blank according to this invention includes a usual photo-mask blank having the light shielding film, the phase shift mask blank (namely, a half tone type phase shift mask blank) having a half tone film as the light shielding film, and a phase shift mask blank for forming a phase shift film. The light shielding film has a light shielding function and may include a combination of a half tone film and the thin film having a light shielding function. The phase shift mask blank may include a combination of the light shielding film and a phase shift film having a phase shift function. When the phase shift film having the phase shift function is formed by etching a transparent substrate, the transparent substrate may be used as the phase shift film or another phase shift film may be formed on the transparent substrate.

The reflection type mask blank may have a substrate of a low thermal expansion coefficient, a light reflection film multi-layered, and a light absorption film forming the transfer pattern.

Moreover, the mask blank may include, except the above-mentioned films, a bottom anti-reflective coating (BARC) film, a top anti-reflective layer (TARL), a resist protection film, a conductive film, and the like. Such films may be partially removed along the circumferential portion to form the mask blank according to either one of the first through the seventh aspects.

According to an eighth aspect of this invention, a method is for use in removing a useless portion by a solvent from a film formed on a surface of a substrate. The method comprises the steps of:

covering the surface of the substrate with a cover member having a solvent path at a peripheral region;

supplying the solvent over the cover member to the useless portion through the solvent path so as to remove the useless portion by the solvent; and adjusting a supply amount and/or a supply position of the solvent fed through the solvent path to the useless portion.

According to the eighth aspect, the solvent path (for example, solvent supply holes) for removing the useless film may be adjusted in size in consideration of a removing width of the useless film. With this structure, it is possible to pertinently attain the desired removing width without designing, preparing, and exchanging a whole of the covers and to therefore easily and surely obtain the substrate (for example, the photo-mask blank) having the desired removing width.

Herein, the solvent means a liquid which is capable of removing the useless film. For example, if the useless film is formed by the resist film, the solvent may be, for instance, an organic solvent for dissolving and removing, or a developer for exposing and removing the useless film. If the useless film is formed by the light shielding film, the solvent may be, for example, an etchant for dissolving the light shielding film.

The solvent path may be structured by solvent supply holes opened in a cover member and formed at positions corresponding to the useless film or portion to supply the solvent to the useless film. Alternatively, the solvent path may be formed between the cover member and a solvent guide member when the solvent guide member is placed outside of the cover member.

According to a ninth aspect of this invention, the useless portion is removed by the solvent through the solvent path by rotating both the substrate and the cover member. Thus, both the substrate and the cover member are rotated to remove the useless portion by allowing the solvent to pass through the solvent path (for example, the solvent supply holes). With this method, it is possible to tangibly and readily supply the solvent to the useless portion by using a centrifugal force. Such using the centrifugal force prevents any invasion of the solvent inwardly and enables to uniformly spread the solvent.

According to a tenth aspect of this invention, the solvent path is formed by solvent supply holes formed around the cover member. All of the solvent supply holes formed in the cover member may be equal to one another in size or changed in size along each side of the substrate. Alternatively, the solvent supply holes may be changed at every area in size or may be changed in size at every hole.

According to an eleventh aspect of this invention, a useless film removing apparatus is for use in removing a useless portion by a solvent from a film formed on a substrate surface. The useless film removing apparatus comprises:

a cover member for covering the substrate surface; and a solvent supply unit for supplying the solvent over the cover member.

The cover member has a solvent path for guiding the solvent from the solvent supply unit to the useless portion and comprises:

adjusting means for adjusting a supply amount and/or a supply position of the solvent supplied to the useless portion.

According to the eleventh aspect, the adjusting means for adjusting sizes of the solvent path for dissolving the useless film is attached to the cover member. With this structure, it is possible to adaptively control the removing width without designing, preparing, and exchanging the whole of the cover member and to obtain a desired removing width. As a result, the substrate, such as the photo-mask blank, can be tangibly and readily obtained which has the desired removing width.

Specifically, the cover member mentioned in the useless film removing method and apparatus is located over the removing portion of the substrate principal surface with a gap left between the removing portion of the substrate principal surface and the cover member and with a spacing which is left between a non-removing portion of the substrate principal surface and the cover member and which is greater than the gap. The gap is set up in size such that the solvent is guided through the gap and is spread only in the gap.

Thus, the cover member is located over the useless portion to be removed and is remote from the substrate principal surface by the gap of a predetermined size. The gap between the substrate principal surface and the cover member is filled or supplied with the solvent due to surface tension and meniscus of the solvent but the spacing between the non-removing portion and the substrate principal surface causes no surface tension to occur and is therefore not supplied with any solvent. Using the above-mentioned principle makes it possible to accurately remove the useless film and to control the removing portion.

According to a twelfth aspect of this invention, the solvent path is specified by a lot of solvent supply holes formed at a circumferential portion of the cover member. In this event, the adjusting means may adjust the supply amount and/or the supply positions of the solvent by controlling the positions of the gap left over the removing portion of the substrate principal surface. A desired removing area and the desired removing width can be accomplished by changing the cover member partially or totally.

On the other hand, when a solvent guide member is placed outside of the cover member, the solvent path may be formed between the cover member and the solvent guide member. With this structure, the desired removing area and the desired removing width can be obtained in manners mentioned in conjunction with the following thirteenth and fourteenth aspects of this invention. This structure is more preferable than the structure according to the twelfth aspect in view of simplification of the apparatus.

According to the thirteenth aspect of this invention, the adjusting means mentioned in conjunction with the useless film removing apparatus according to the eleventh aspect comprises an exchangeable solvent supply member which has the solvent supply hole determined in diameter and/or arrangement thereof and which is exchangeably attached to a predetermined portion of the cover member. The supply amount and/or the supply position are adjusted by exchanging the exchangeable solvent supply member from one to another.

Thus, the adjusting means may be formed by a member which is detachably attached to a peripheral portion of the cover member, as mentioned before, and which has holes of a predetermined size. In this case, a plurality of solvent supply members that have different hole sizes and different hole positions may be prepared in advance, which serves to inexpensively cope with changing the removing widths. The solvent supply member may be structured by elements that are changed one at a time or by elements that are partially changed at every side of the substrate. Furthermore, the solvent supply member may have elements or members exchanged at a predetermined region. Solvent supply holes formed in the solvent supply member may be all equal in size to one another or may be changed in size at every side of the substrate or a predetermined region of the substrate. In addition, the solvent supply holes may be individually changed in size.

The solvent supply member may be, for example, a member for forming an identification pattern which may be indicative of a photo-mask blank. In this event, the solvent supply member has holes arranged in accordance with the identification pattern, such as a triangle, a square, or a barcode pattern. This structure serves to directly attach specifications, types, product numbers, lot number, and the like to the photo-mask blank.

These identification pattern can be readily removed by etching carried out in a photo-mask manufacturing process, if unnecessary. The identification pattern may be formed by a barcode recognized by using reflection of the resist film partially removed and an underlying light shielding film or by using reflection of a transparent substrate or base and resist and/or light shielding films partially removed.

The mask blank, for example, the photo-mask blank with the barcode pattern formed along the circumferential portion of the substrate principal surface may be manufactured by partially dissolving and removing the resist film by the solvent or may be manufactured by removing, by the use of a laser beam, the resist film, or a combination of the resist film and a film that causes any optical variation to occur due to exposure light.

According to a fourteenth aspect of this invention, the adjusting means in the useless film removing apparatus according to the eleventh aspect has the solvent supply hole that is placed at a predetermined position and that is adjustable in diameter, so as to adjust the solvent supply amount and/or the solvent supply position by controlling the diameter of the solvent supply hole.

The adjusting means according to the fourteenth aspect may have a mechanism for adjusting each size of the solvent supply hole.

The adjusting means according to the fourteenth aspect may have an adjusting mechanism manually or automatically controlled.

When the adjusting means is automatically controlled, each adjusting mechanism may be connected to a computer so as to automatically control each size of the hole or holes on the basis of data given to the computer. In addition, a monitor may be attached to the useless film removing apparatus so as to always monitor the width of the useless film. With this structure, it is possible to adjust the size of each solvent supply hole in real time, monitoring progression of removing the useless film.

According to a fifteenth aspect of this invention, a method is for use in manufacturing a mask blank through a film forming process of forming a transfer pattern film to be transferred into a transfer pattern and forming at least a resist film. The method comprises the step of:

removing a useless film from the films formed by the above-mentioned film forming process, by using the method according to any one of the eighth through the tenth aspects.

According to the fifteenth aspect, it is possible to obtain the mask blank manufacturing method that can readily, tangibly, and accurately change and remove the width of the useless film in accordance with various applications. The mask blank manufacturing method according to the fifteenth aspect is effective to manufacture a mask blank that has a removing portion or area which is formed along a circumferential portion and which may be adaptively controlled. Specifically, the method serves to form an earth terminal of an electron beam drawer, a substrate support area contacted with a support member, and/or adjacent areas to the earth and the substrate support areas. In addition, the method is also effective to remove the resist film from a circumferential portion for avoiding occurrence of dust.

According to a sixteenth aspect of this invention, a method is for use in manufacturing a mask from the mask blank obtained by the method according to the fifteenth aspect of this invention and comprises the step of:

patterning the films into a transfer pattern.

The method according to the sixteenth aspect is effective to provide the mask (such as the photo-mask) that has a reduced number of defects and the mask (such as the reticle) that can be accurately positioned on the exposure device when the mask is held on the exposure device.

BRIEF DESCRIPTION OF THE DRAWING

FIGS. 1A and 1B show a sectional view and a partial plan view for use in describing a useless film removing apparatus according to an embodiment of this invention;

FIG. 2 shows an enlarged view of a part of the apparatus illustrated in FIG. 1;

FIGS. 8A and 8B show a sectional view and a plan view for use in describing a cover member used to manufacture a photo-mask blank;

FIGS. 9A, 9B, and 9C show a plan view, a right-hand side view, and an elevation view for use in describing a photo-mask blank manufactured by the use of the cover member illustrated in FIGS. 8A and 8B;

FIG. 10 shows a view for use in describing another cover member used to manufacture a photo-mask blank;

FIGS. 11A and 11B show a plan view and an elevation view for use in describing another photo-mask blank manufactured by the use of the cover member illustrated in FIG. 10;

FIGS. 12A, 12B, and 12C show a plan view, a left-hand side view, and an elevation view of another photo-mask blank according to this invention;

FIG. 13 shows a view for use in describing a photo-mask blank from which a peripheral area is removed;

FIGS. 14A, 14B, and 14C show plan, side, and elevation views for use in describing another photo-mask blank which can be manufactured by this invention;

FIG. 15 shows a plan view for use in describing a photo-mask blank to which this invention is applicable;

DESCRIPTION OF THE PREFERRED EMBODIMENTS

Referring to FIGS. 1A through 5, description will be made about a useless film removing apparatus and method according to an embodiment of this invention. In the illustrated example, description will be also made about a method of manufacturing a mask blank, especially, a photo-mask blank, which is also related to this invention. In the following, description will be at first directed to the photo-mask blank and then to the useless film removing apparatus, and thereafter to the method of manufacturing the photo-mask blank together with the method of removing the useless film.

Finally, description will be made about the photo-mask blank manufactured by the manufacturing method.

In FIGS. 1A through 5, a substrate 10 may be a photo-mask blank (FIGS. 2 and 3) which has a transparent base 11 of synthetic quartz glass on a front surface of the transparent base, a light shielding film 12 of chromium, and an unbaked resist film 13. Specifically, the transparent base 11 has a size of 6 (inches)×6 (inches)×0.25 (inch) (1 inch=25.4 mm) while the unbaked resist film 13 is 4000 angstroms thick and may be formed, for example, by a trade name "PBSC" manufactured and sold by Chisso Corporation (Tokyo). Herein, the unbaked resist film 13 is assumed to be coated on the light shielding film 12 by a spin coating method and may be naturally coated only on a main part of the transparent base 11. However, it is to be noted that the resist film 13 is practically coated not only on a peripheral area of the base surface not to be coated but also on a side surface of the transparent base 11 and occasionally its back surface. In this connection, the peripheral area and the side and the back surfaces may be collectively called undesired portions while the resist film on the undesired portions may be referred to as a useless film.

The useless film removing method and apparatus according to the embodiments are used to remove the useless film on the undesired portions.

Figure 3:
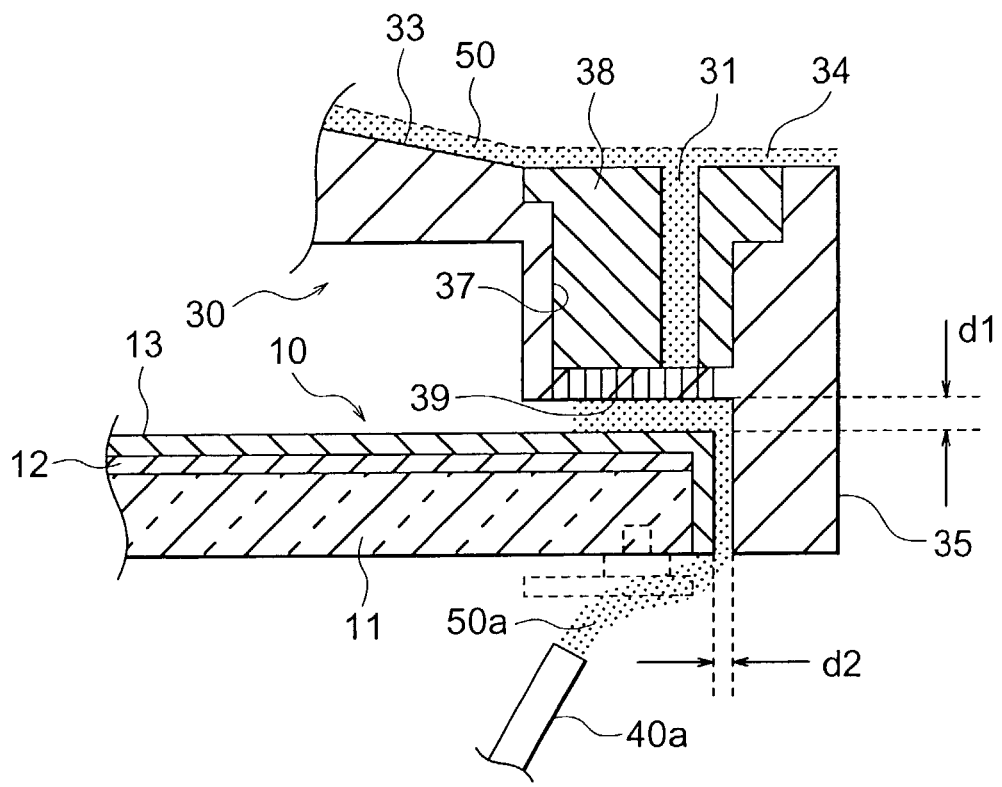
FIG. 3 shows another enlarged view of another part of the apparatus illustrated in FIG. 1.
Figure 4:
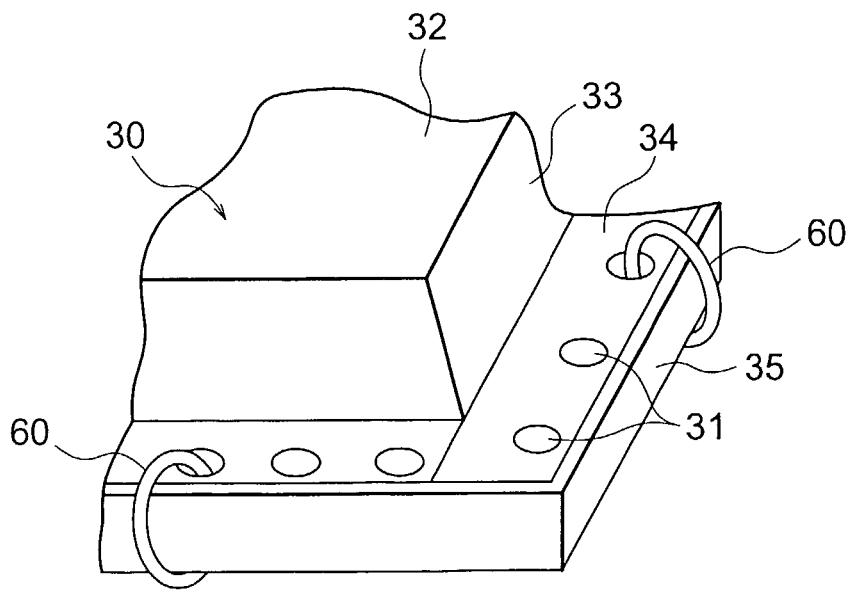
FIG. 4 shows a perspective enlarged view of a part of the apparatus illustrated in FIG. 1.
Figure 5:
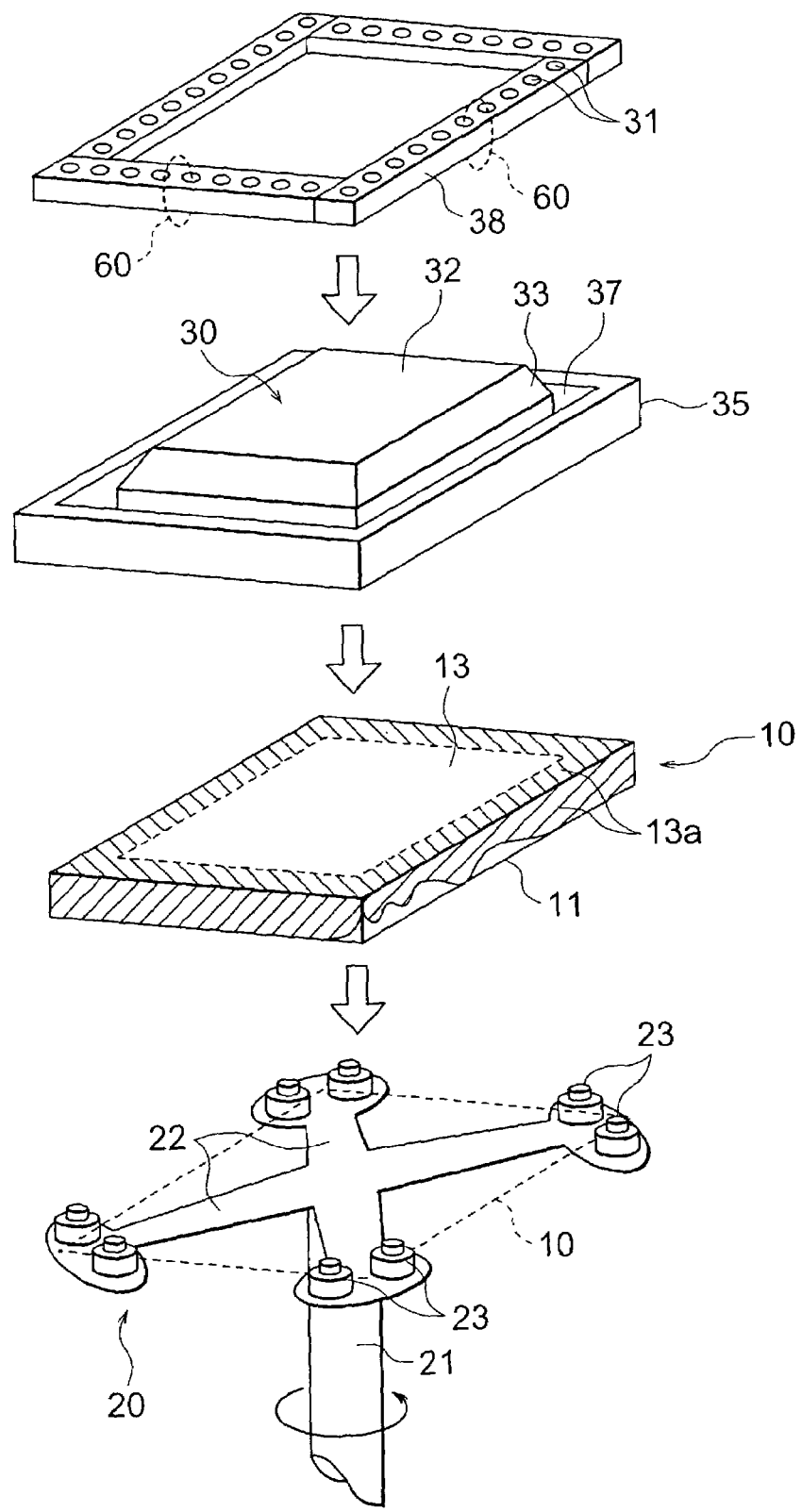
FIG. 5 shows an exploded perspective view of the useless film removing apparatus according to the embodiment of this invention.

As shown in FIG. 1A, the useless film removing apparatus according to the embodiment of this invention has a cover member 30 which covers an upper side of the substrate 10 and which has solvent supply holes 31. The substrate is placed and held on a rotation table 20. In the illustrated example, a solvent 50, such as methyl cellulose acetate (MCA), is spouted from a nozzle 40 placed upwards of the cover member 30 and is supplied through the solvent supply holes 31 of the cover member 30 onto the useless film depicted by 13a (FIG. 5). In consequence, the useless film on the undesired portions is dissolved by the solvent by the use of the useless film removing apparatus.

The cover member 30 covers the substrate 10 from above like a cap and has a center region, a peripheral region, and an intermediate region between the center and the peripheral regions. As best shown in FIG. 1A, the center region is flat and is called a flat portion 32 while the intermediate region is oblique from the center region to the peripheral region and may be called an oblique portion 33. The oblique portion 33 is contiguous to the peripheral portion that forms a thick circumferential portion 34 and that is also contiguous to a side surface 35 extended downwards from the thick circumferential portion 34.

The illustrated cover member 30 has a solvent supply member 38 which is detachably fitted to the circumferential portion 34 and which has a multiple number of solvent supply holes 31, formed by through holes. The illustrated solvent supply member 38 is fitted to a fitting groove 37 formed on the circumferential portion 34. The fitting groove 37 has a perforated bottom on which a great number of pin holes are formed, as shown in FIG. 1B, and are smaller in diameter than the solvent supply holes 31. The perforated bottom of the fitting groove 37 has a mesh like configuration. With this structure, it is noted that a supply amount of the solvent is determined by each diameter of the solvent supply holes 31, not by each diameter of the pin holes 39. As illustrated in FIG. 1A, a flat portion is formed when the solvent supply member 38 is fitted to the groove 37 while the main body and the side portion 35 of the cover member 30 are associated with the bottom of the fitting groove 37.

The solvent supply holes 31 on the solvent supply member 38 are selected in configuration, size, and spaces between the solvent supply holes 31 in consideration of viscosity of the solvent 50. Specifically, each solvent supply hole 31 may have a square, a rectangular, a circular, an oval shape, or any other shape while a size of each solvent supply hole 31 may be selected so that the solvent 50 is evenly supplied to a whole of the useless portion 13a at a constant rate. A distance between two adjacent ones of the solvent supply holes 31 is set up so that the solvent 50 supplied through the holes 31 is spread over the useless portion 13a without any spacing.

In the illustrated example, each diameter of the solvent supply holes 31 is equal to or smaller than 10 mm so as to pass through the solvent 50 by an amount necessary for removing or dissolving the useless portion 13a adjacent to each hole 31. In addition, the distance between the solvent supply holes 31 is equal to or smaller than 10 mm. When the diameter of each hole 31 is too small, the useless portion 13a adjacent to the each hole 31 can not be removed or dissolved. When its diameter exceeds 10 mm, an irregular boundary is susceptible to take place between a removed portion and the remaining portion and a mechanical strength of the cover member 30 becomes weak. An extremely narrow distance between the holes 31 makes it difficult to keep a mechanical strength of the cover member 30 and can not achieve a stable supply of the solvent 50 in dependency upon each diameter of the holes 31. To the contrary, a distance more than 10 mm gives rise to an irregular boundary between the removed portion and the remaining or non-removed portion and makes it difficult to accurately and completely remove a portion to be removed.

Among the solvent supply holes 31 of the substrate 10, some holes (for example, four holes) accommodate threads 60 that are extended through the holes and that are resistant to the solvent 50. The threads 60 are interposed between an inner wall of the cover member 30 and the surface of the substrate 10 to regulate a gap between them. To this end, each thread 60 forms a loop which is allowed to pass through the corresponding solvent supply hole 31, to pass between the bottom wall of the fitting groove 37 and the surface of the substrate 10, to pass between the inner wall of the side portion 35 and the side surface of the substrate 10, to pass outside of the side portion 35 of the cover member 30, and to pass through the circumferential portion of the peripheral flat portion 34.

Consideration will be made about a thickness of each thread 60. At first, let the gap between the bottom wall of the fitting groove 37 and the surface of the substrate 10 be represented by d1. In this event, the thickness of each thread is selected so that the solvent 50 is guided through the gap d1 and is spread into the gap d1 by a surface tension and a meniscus of the solvent 50. In the illustrated example, the gap d1 is selected between 0.05 mm and 3 mm. It has been confirmed that a gap less than 0.05 mm and more than 3 mm makes it difficult to guide and spread the solvent 50 through the gap d1 and leaves a non-removed portion and causes an irregular boundary to occur between the removed and non-removed portions.

A gap d2 between the inner wall of the side portion 35 and the side surface of the substrate 10 is selected in size so that the solvent 50 may pass through the gap d2 with the solvent 50 contacted with the film. The gap d2 is preferably equal to d1 but may be different from the latter. When the gaps d1 and d2 are different from each other, another hole may be perforated on the side portion 35. With this structure, a thread of a different thickness may be allowed to pass through another hole so as to regulate or adjust the gap d2 in size.

As shown in FIG. 1A, the substrate 10 has a surface area that is opposite to an inner wall of the flat portion 32 placed at the center region of the cover member 30 and that acts as a film necessary area except a film unnecessary area. A gap d3 between the inner wall of the cover member 30 and the above-mentioned surface area of the substrate 10 is selected so that it is larger than the gap d1. It is possible with this structure to avoid any surface tension of the solvent 50 on the surface area. In addition, the gap d3 is also helpful to alleviate any influence of heat transfer and convention of a gas. Specifically, the heat transfer might be caused to occur from the inner wall surface of the cover member 30 and might influence a temperature distribution on the film of the substrate 10. The convection of the gas might occur in the gap d3 and might influence the temperature distribution on the film of the substrate 10. Under the circumstances, it is preferable that the gap d3 should be wide not to cause the heat transfer to occur and narrow not to cause the convection to occur.

Taking the above into account, the gap d3 is selected between 0.05 mm and 20.0 mm. The gap d3 less than 0.05 mm is liable to an influence of the heat transfer. For example, when a large temperature distribution takes place on the cover member 30 surface due to heat of evaporation of the solvent 50 that irregularly acts on the cover member 30, the temperature distribution directly reflects on the resist film. As a result, the resist film also has a temperature distribution influenced by that on the cover member 30. On the other hand, the gap d3 greater than 20.0 mm may cause natural convection to occur and might bring about a temperature distribution on the resist film. Herein, it is to be noted that the temperature distribution due to the natural convention can be alleviated by uniformly and forcibly agitating the gas within the gap d3. Using such an agitator makes it possible to widen the gap d3 greater than 20.0 mm.

However, widening the gap d3 results in heightening the flat portion 32 of the cover member 30. When the flat portion 32 becomes too high, the solvent 30 supplied from the nozzle 40 is supplied to the circumferential portion 34 through a long path and may be evaporated on the way. In addition, when the cover member 30 and the substrate 10 are both rotated, the solvent 50 is circumferentially and undesirably scattered. Moreover, the apparatus becomes large in scale and is not preferable.

As mentioned before, the cover member 30 has the solvent supply holes 31 for dissolving and removing the useless film by supplying the solvent 50 from the solvent supply apparatus to the useless film. The solvent supply holes 31 are formed in the solvent supply member 38 fitted to the fitting groove 37 of the cover member 30. By determining the diameters and/or the arrangement of the solvent supply holes 31 formed in the solvent supply member 38, it is possible to adjust the supply amount and/or the supply positions of the solvent 50 supplied through the solvent supply holes 31 to the useless film. From this fact, it is readily understood that a plurality of the solvent supply members 31 having different solvent supply holes 31 are previously prepared and may be exchanged from one to another in consideration of the solvent supply amount and/or supply positions. In this event, the plurality of the solvent supply members 31 serve as adjusting means for adjusting the amounts and/or the supply positions.

In other words, a width of removing the useless portion, namely, a removing width can be pertinently adjusted by exchanging the solvent supply members 38 in consideration of the size and/or the positions of the solvent supply holes. The solvent may be used for dissolving and/or removing the useless film or portion.

Stated otherwise, the removing width can be adjusted to an optimum removing width without designing, preparing, and exchanging a whole of the cover member 30. Therefore, a desired substrate (for example, a photo-mask blank) can be readily and surely obtained which has a desired removing width.

In addition, various modifications may be made about the sizes and/or the positions of the solvent supply holes 31. The solvent supply holes 31 formed in the solvent supply member 38 may be all identical in size with one another or may be changed along each side of the substrate 10. Alternatively, the solvent supply holes 31 may be changed at every one of regions or may be varied in size at every hole. The solvent supply member 38 may be integrated or may be divided into a plurality of parts. For example, the solvent supply member 38 may be divided along each side of the substrate 10, along predetermined areas of the substrate 10, or at every one of the solvent supply holes 31.

The above-mentioned adjusting means for adjusting the supply amounts and/or the supply positions of the solvent have been realized by preparing the solvent supply members having the solvent supply holes and by attaching each of the solvent supply members to the peripheral portion of the cover member 30 by exchanging them from one to another. However, the adjusting means may not be restricted to the above-mentioned structure. For example, the solvent supply holes 31 have diameters greater than the above-mentioned holes and the diameters of the holes may be controlled by shutters or plates. This structure dispenses with exchange of the solvent supply members 38.

Figure 6:
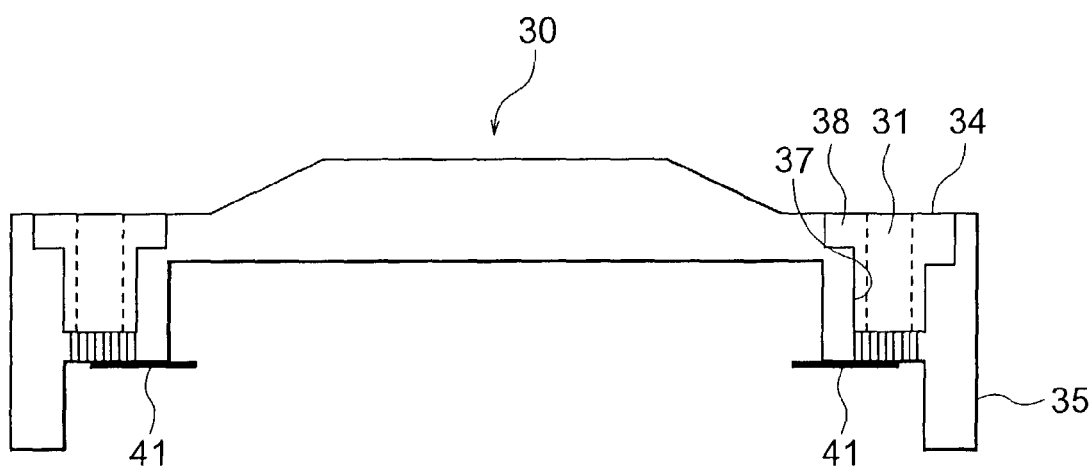
FIG. 6 shows a partial sectional view of another useless film removing apparatus according to a modification of this invention.

Referring to FIG. 6, the adjusting means is illustrated which has an opening and closing plate 41 to control the diameters of the solvent supply holes 31. The illustrated solvent supply member which has the solvent supply holes is attached to a predetermined position of the cover member 30 in a manner similar to the above-mentioned embodiment.

On the other hand, it is to be noted in FIG. 6 that a slide plate or a slider is placed along the bottom of the fitting groove 37 and is moved by an adjusting mechanism 41 to control the diameters of the solvent supply holes 31 by the adjusting mechanism 41. Specifically, the sizes and/or the positions of the solvent supply holes 31 can be varied by controlling the diameters of the solvent supply holes 31 by the adjusting mechanism 41 and, as a result, the amounts and/or the positions of the solvent 50 can be adjusted. The illustrated solvent supply member 38 may be integrated with the cover member 30 or may be separated from the cover member 30. In the illustrated example, if the solvent supply member 38 which is separated from the cover member 30 can be exchanged from one to another, fine control can be achieved about a flow rate and/or the positions.

The adjustment mechanism 41 may be adjusted manually or automatically by a machine. In this case, it is assumed that the adjustment mechanism 41 is adjusted by the machine. In this case, the adjustment mechanism 41 for adjusting the solvent supply holes 31 is connected to a computer (not shown) given data in connection with the adjustment mechanism 41. The slider is moved in accordance with the data sent from the computer. Thus, the sizes of the solvent supply holes 31 can be automatically adjusted. Furthermore, the useless film removing apparatus illustrated in FIG. 6 may have a monitor for always monitoring the removing width of the useless film. With this structure, the slider can be moved in real time to adjust the sizes of the solvent supply holes 31, with a progression of removing the useless film always monitored.

Now, the substrate 10 is held on the rotation table 20 and is rotated to be processed. In the illustrated example, the cover member 30 has the solvent supply member 38 fitted thereto and is covered on the substrate 10. The rotation table 20 has four support arms 22 mounted on a rotation axis 21 and horizontally and radially extended from the rotation axis 21 and a pair of support pedestals 23 attached to ends of the support arms 22. The support pedestals 23 are placed at four corners of the substrate 10 to support the substrate 10 thereon. The rotation axis 21 is coupled to a rotatable drive device (not shown) and is rotated at a predetermined rotation speed by the drive device. A solvent supply nozzle 41a is also placed under the substrate 10. This structure is very helpful to certainly remove the useless film or portion by supplying the solvent 50 from both the nozzles 40a and 40.

Figure 7:
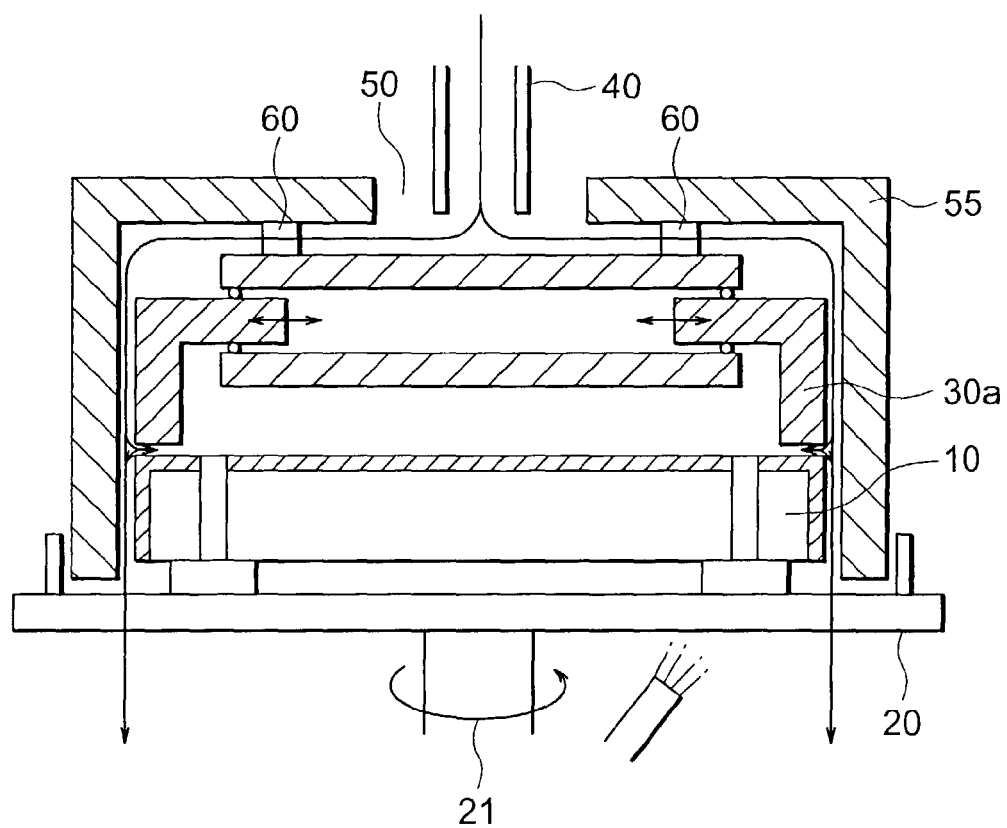
FIG. 7 shows a sectional view of a useless film removing apparatus according to another embodiment of this invention.

Referring to FIG. 7, a useless film removing apparatus according to another embodiment of this invention is similar to that illustrated in FIGS. 1A through 5 except that the illustrated cover member 30a comprises no solvent supply holes and a solvent guide member 55 is placed to enclose the cover member 30a and the side surface of the substrate 10. As shown in FIG. 7, the solvent guide member 55 is fixed to the cover member 30a by a connection member 60, with a spacing left between the solvent guide member 55 and the cover member 30a. Thus, the spacing between the solvent guide member 55 and the cover member 30a serves as a solvent path. The solvent guide member 55 has a solvent supply opening facing the nozzle 40 to receive the solvent 50. The solvent supply opening of the solvent guide member 55 guides the solvent onto the cover member 30a. The solvent flows along a peripheral surface of the cover member 30a and is given onto the useless portion of the substrate 10.

In the illustrated useless film removing apparatus, it is possible to partially or totally move or vary the side surface of the cover member 30a adjacent to the substrate 10 inwardly by a variable mechanism (not shown). The illustrated structure can determine a desired removing area and a desired removing width. In addition, it is preferable that a gap d1 between the bottom wall of the side surface of the cover member 30a and the surface of the substrate 10 is set so that the solvent can spread through the gap due to the surface tension and the meniscus of the solvent when the solvent is given to the gap.

The useless film is removed or dissolved by the above-mentioned apparatus in a manner to be described below. At first, the substrate 10 is placed on the rotation table 20 and is covered by the cover member 30 (or the cover member 30a and the solvent guide member 55). The solvent 50 is supplied through the nozzle 40 with the supply amount adjusted. At the same time, the rotation table 20 is rotated at a rotation speed between 100 and 1000 rpm for a duration between 1 and 60 seconds. By this operation, the solvent 50 is guided through the solvent supply holes 31 onto the useless portion 13a and, as a result, the useless portion 13a is dissolved and removed. At a time close to an end, the solvent 50a is spouted from the nozzle 40a to securely remove the useless film portion 13a. Thus, the useless film portion 13a is removed. Thereafter, a baking process is carried out about the substrate 10 subjected to the above removing process. As a result, a photo-mask blank is obtained which has a resist film of a substantial square shape at a center region.

Herein, it is noted that the useless film can be also removed by exposing and developing the useless film by supplying a developer onto the useless film. In this event, exposure is carried out by guiding exposure light onto the useless film from an exposure light source through an optical fiber acting as a transmission element. Thereafter, the exposed substrate 10 is set onto the useless film removing apparatus in the above-mentioned manner. The solvent 50 is given to the substrate 10 so that it is supplied onto the useless film portion alone and, as a result, the useless film is dissolved and removed. Finally, the baking processing is carried out to obtain the photo-mask blank with the resist film left at the center portion in the square shape.

Subsequently, a visual observation has been made about the photo-mask blank obtained by the above-mentioned manner. As a result, it has been found out that no irregular color of a ring shape can be seen which might be caused to occur due to a temperature distribution of the resist film appearing during the processing. Moreover, it has been also found out that boundaries between the resist film and the removed portion are substantially straight and the removing width is substantially constant. According to a microscope observation of the resist, no pin holes have been observed on the resist film due to droplets of the solvent and the like.

Next, description will be made about a typical photo-mask blank that is manufactured by the above-mentioned method of manufacturing the photo-mask blank.

Referring to FIGS. 8A and 8B, a cover member 30 is illustrated which is used to manufacture a photo-mask blank having four sides and different removing widths along each side. In this case, the cover member 30 of a rectangular or a square shape has four sides and a fitting groove along a peripheral portion. As shown in FIG. 8B, four solvent supply members 38a to 38d are fitted into a fitting groove and have the same length. Each of the four solvent supply members 38a to 38d has a plurality of solvent supply holes arranged in line. With this structure, each end of the solvent supply members 38a to 38d is placed at each corner of the cover member 30 when the solvent supply members 38a to 38d are fitted in the illustrated manner.

In the illustrated example, the solvent supply members 38c and 38d arranged along left and right hand sides of the cover member 30 have the solvent supply holes that are arranged in line outside of the respective solvent supply members 38c and 38d. On the other hand, the solvent supply members 38a and 38b arranged along upper and lower sides of the cover member 30 have the solvent supply holes arranged inside of the respective solvent supply members 38a and 38b.

The cover member 30 to which the solvent supply members 38a to 38d are fitted covers the surface of the substrate 10 in the above-mentioned manner. The solvent 50 is supplied from the upper part of the cover member 30 to guide the solvent 50 onto the useless film portion of the substrate 10. The resultant useless film portion is dissolved and removed by the solvent 50.

In consequence, the substrate 10 illustrated in FIGS. 9A through 9C is obtained in the above-mentioned processing. Specifically, the substrate 10 has a transparent base 11, the light shielding film 12, and the resist film 13 left at the center area of the substrate 10 on the light shielding film 12. As shown in FIG. 9A, the removing widths along the upper and the lower sides of the substrate 10 are depicted by a while the removing widths along the left and the right hand sides of the substrate 10 are depicted by β. As readily understood from FIG. 9A, the removing width α is wider than the removing width β, namely, α>β. As a result, the exposed light shielding film 12 also has different widths by removing the resist film 13 by the different widths along the sides. Thus, the above-mentioned method can manufacture the photo-mask blank (depicted by 80) which has the resist film removed by the different removing widths along the sides.

Referring to FIG. 10, illustrated is a cover member 30 that is used to manufacture a photo-mask blank with a barcode pattern. The cover member 30 has four solvent supply members 38a to 38d that are similar to those illustrated in FIGS. 8A and 8B, except that the illustrated solvent supply members 38 have a plurality of solvent supply holes 31 arranged in the same positions of the upper, the lower, and the left and the right hand sides. In other words, each solvent supply hole 31 is opened at the same positions along the upper, the lower, the right, and the left sides. Moreover, it is to be noted that solvent supply holes 31b are opened along the lower side to form a barcode pattern by varying the configurations of the solvent supply holes 31 together with a modification of the cover member 30 shown in FIGS. 9A through 9C. When the useless film portion is removed from the illustrated cover member 30 by the solvent 50, a photo-mask blank 100 is manufactured which has a barcode pattern corresponding to the barcode pattern solvent supply holes 31b.

Referring to FIGS. 12A through 18 together with FIGS. 19 and 20, description will be made about a photo-mask blank. In FIGS. 12A, 12B and 12C, the photo-mask blank is exemplified which has four sides and which removes the resist films formed along a peripheral area of the two sides and leaves the resist films formed along the two remaining sides. The illustrated photo-mask blank 110 has three reticle chuck support regions 71 to be chucked or captured by a reticle chuck. As shown in FIG. 12A, two of the reticle chuck support regions are placed at an area adjacent to the left-hand side of the photo-mask blank 110 while one of the reticle chuck support region is placed at an area close to the right-hand side of the photo-mask blank 110. In this connection, the resist film 13 is not removed from peripheral areas which are adjacent to both the left-hand and right-hand sides and which have the reticle chuck support regions. Instead, the resist film 13 is removed from other peripheral areas which have no reticle chuck support region and which are adjacent to the upper and the lower sides of the photo-mask blank 110. In the illustrated example, resist removed areas formed along the upper and the lower sides of the illustrated photo-mask blank have widths of 2.0 mm, respectively.

As mentioned before, the resist film 13 is removed or peeled off from the peripheral areas along the upper and the lower sides along which no reticle chuck support regions is formed. This structure serves to suppress occurrence of any dust resulting from undesirable separation of the resist film 13 from the peripheral areas. As mentioned before, the resist film 13 remains on the reticle chuck support regions 71 and their peripheral regions placed on both left and right sides of each support region 71. With this structure, it is possible to locate a reticle with a high accuracy of position on an exposure device when a reticle chuck adsorbs the reticle obtained by patterning the illustrated photo-mask blank by the use of a photolithography technique.

Referring to FIG. 13, another photo-mask blank 112 is exemplified which leaves the resist film 13 only at adjoining areas adjacent to the reticle chuck support regions 71 and which removes the resist film 13 from areas except the adjoining areas to the reticle chuck support regions 71. Specifically, the illustrated photo-mask blank 112 has an expanded resist removed areas formed along the peripheral portion of the photo-mask blank 112. As shown in FIG. 13, the resist removed areas are expanded to areas very close to the reticle chuck support regions 71. In the illustrated example, the resist removed areas have widths of 1.0 mm. This structure can effectively suppress occurrence of dust as compared with the photo-mask blank illustrated in FIG. 12A through 12C and makes it possible to remove the resist film in consideration of a configuration of a reticle chuck.

Referring to FIGS. 14A through 14C, a photo-mask blank 113 has controlled resist removed areas in consideration of a supplementary pattern forming areas 72. Herein, the supplementary pattern forming areas 72 are for forming supplementary patterns, such as a barcode pattern, an alignment mark, a quality assurance (QA) pattern, and the like when a photo-mask is manufactured. The illustrated photo-mask blank can be manufactured only by exchanging the solvent supply members alone and without exchanging any cover member. Specifically, the photo-mask blank can be obtained by removing the useless resist film without removing the supplementary pattern forming areas 72. In other words, the resist film is effectively left on the supplementary pattern forming areas 72. As illustrated in FIG. 14A, the resist removed areas along the four sides of the photo-mask blank have different widths with reference to the supplementary pattern forming areas 72. Specifically, the resist removed areas have widths of 1.0 mm along the left side, 0.5 mm along the upper side, 1.5 mm along the lower side, and 0.0 mm along the right side. Each width is measured from the side surface of the substrate.

As mentioned before, it is possible to remove the resist film formed along the four sides in different widths and also to avoid occurrence of defects on the supplementary patterns because the removed widths can be optionally controlled and, consequently, the resist film is not removed on the supplementary pattern forming areas. In addition, occurrence of dust is also avoided that might result from separation of the resist film from the circumferential areas of the substrate. Moreover, this structure can cope with different specifications that are given from different mask manufacturers or companies in relation to the supplementary patterns. For example, it is possible to avoid undesirable removal of the resist film 13 from an alignment mark area when the useless film is removed or dissolved. This shows that the alignment mark can be surely formed or left on the mask. In this case, removing the useless film from the circumferntial portion of the mask substrate can be carried out by using the same cover member and by exchanging the solvent supply members alone.

In addition, the alignment mark may be located on the mask at different positions determined in every mask manufacturer. The above-mentioned cover member may not be changed in design and in size in consideration of the alignment mark. Therefore, the cover member is very inexpensive and can readily do maintenance without exchanging the cover member.

Referring to FIG. 15, illustrated is a photo-mask blank which removes the resist film formed on the circumferential portions of the photo-mask blank, except the adjoining areas of the supplementary pattern forming areas. Differing from FIG. 14A, the photo-mask blank 114 illustrated in FIG. 15 has expanded resist removed areas to areas adjacent to the supplementary pattern forming areas 72. The illustrated resist removed areas are 1 mm wide along all the sides of the photo-mask blank. According to this structure, the resist film can be removed in accordance with a configuration of the supplementary pattern forming areas with occurrence of dust suppressed.

Figure 16:
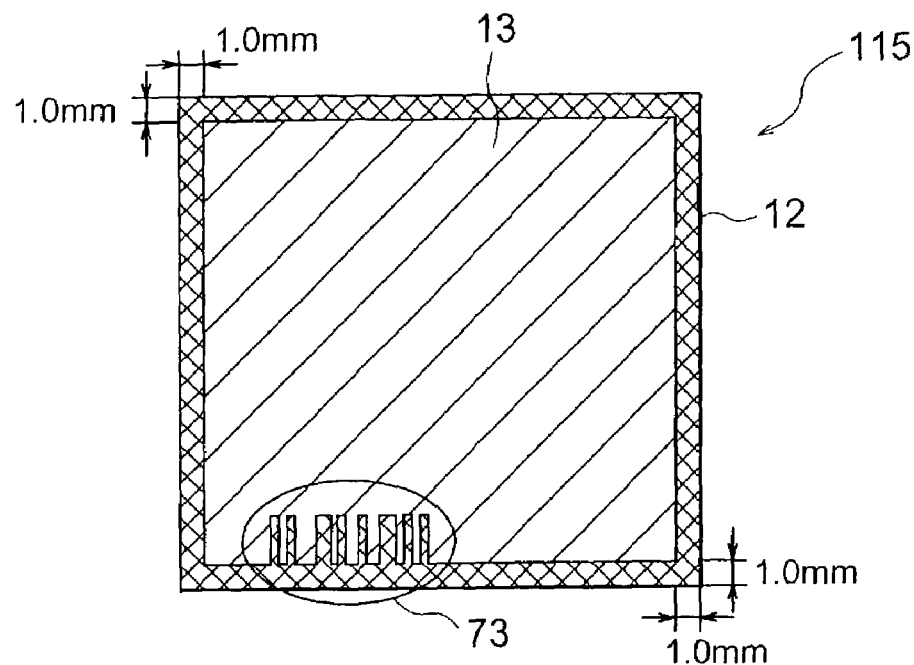
FIG. 16 shows a plan view for use in describing another photo-mask blank which can be manufactured by this invention.

Referring to FIG. 16, illustrated is a specific example of the photo-mask blank 115 which is shown in FIGS. 11A and 11B and which forms a bar code pattern by partially removing the resist film 13. The resist film 13 formed on the circumferential portions of the photo-mask blank 115 is removed over a width of 1.0 mm along all sides while the barcode patter is formed along the lower side of the photo-mask blank 115. The barcode pattern 73 serves as an identification code of the photo-mask blank and may be, for example, defect degree data, as mentioned in the summary of the invention in the instant specification. If the defect degree data is attached in the form of the barcode pattern to the photo-mask blank instead of the mask, the mask blank itself can be identified within a mask case. According to this method, it is possible to always monitor each photo-mask blank during manufacturing the mask by detecting each defect degree data attached to each photo-mask blank as the identification code. This contributes to extreme improvement in reliability of the photo-mask blank. At any rate, the barcode pattern and the identification code can be recognized by image processing.

Figure 17:
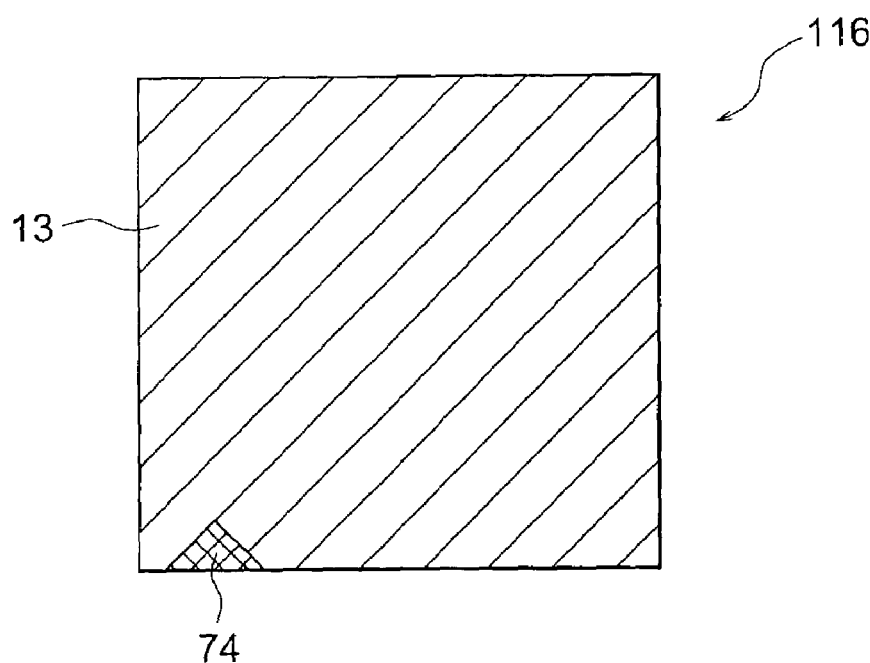
FIG. 17 shows a plan view for use in describing another photo-mask blank which can be manufactured by this invention.
Figure 18:
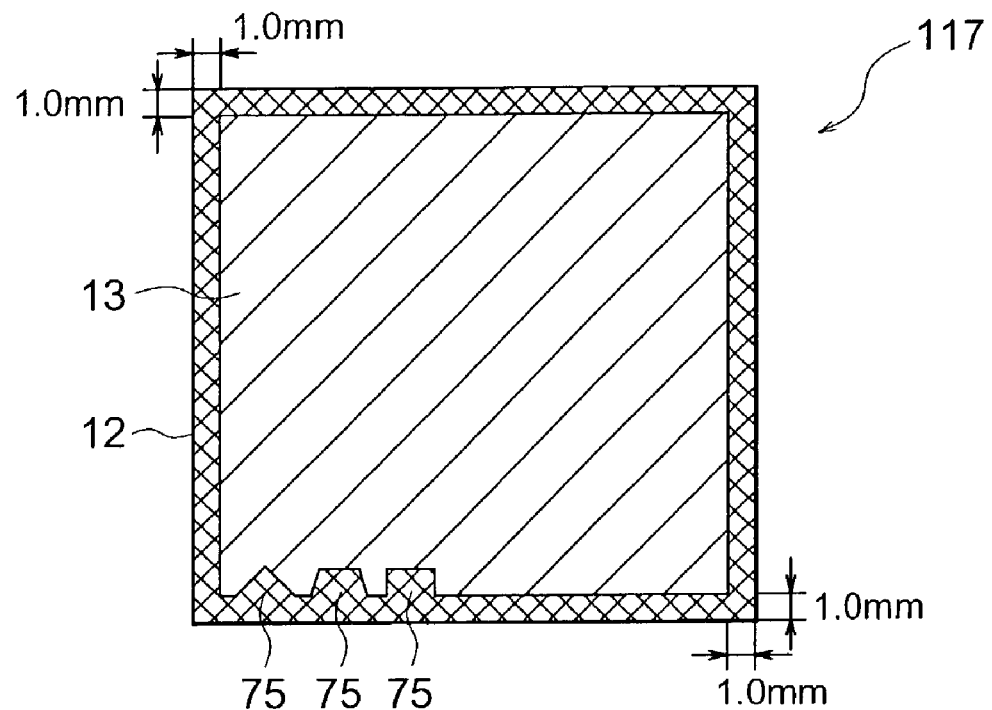
FIG. 18 shows a plan view for use in describing still another photo-mask blank which can be manufactured by this invention.

Referring to FIGS. 17 and 18, shown are photo-mask blanks 116 and 118 which have identification symbols 74 and 75, respectively. The photo-mask blank 116 illustrated in FIG. 17 has a resist film 13 coated on a whole surface including circumferential portions, except an identification pattern 74 of a triangle shape formed by partially removing the resist film 13. In other words, a light-shielding film is exposed at a portion of the identification pattern 74 by partially removing the resist film 13. In FIG. 18, the resist film 13 is removed from the circumferential portions of the substrate by a width of 1.0 mm from the side surface of the substrate. In addition, identification symbols 75 are also formed along the lower side of the substrate by partially removing the resist film 13 and exposing the light-shielding film 12. The illustrated identification symbols 75 are composed of a combination of a triangle, a trapezoid, and a rectangle. The photo-mask blanks 116 and 117 illustrated in FIGS. 17 and 18 can be also identified by detecting the identification symbols 74 and 75 like in FIG. 16.

Figure 19:
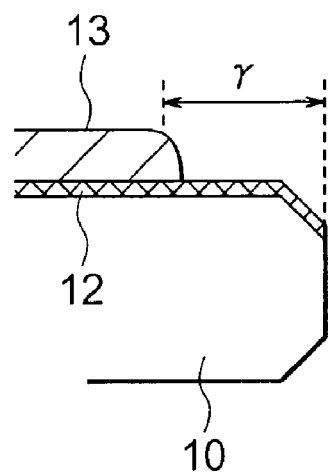
FIG. 19 shows a partial view for use in describing a removed portion and a removed width.

Referring to FIG. 19, the removed area illustrated in FIGS. 12A to 18 has a width which is depicted by γ in FIG. 19 and which is measured from the side surface of the transparent base 11. The width γ is adaptively variable between 0.5 and 3.0 mm in response to user's requirements or user's specifications. In the photo-mask blank illustrated in the above, the resist film coated on the side and the back surfaces of the transparent base 11 by a resist coating process is assumed to be removed by a back rinse process.

Figure 20:
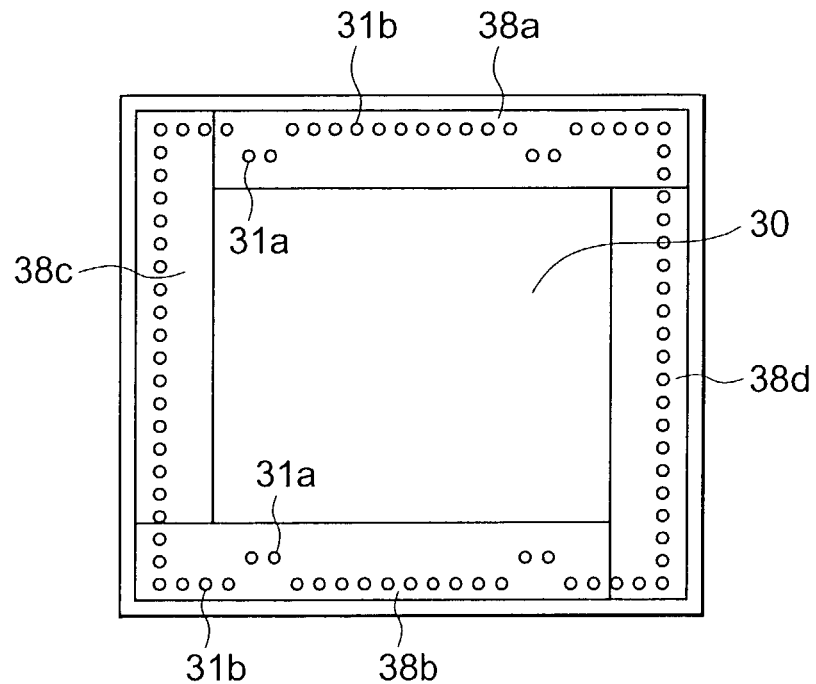
FIG. 20 shows a plan view for use in describing a cover member which is applicable to an electron beam drawer.
Figure 21:
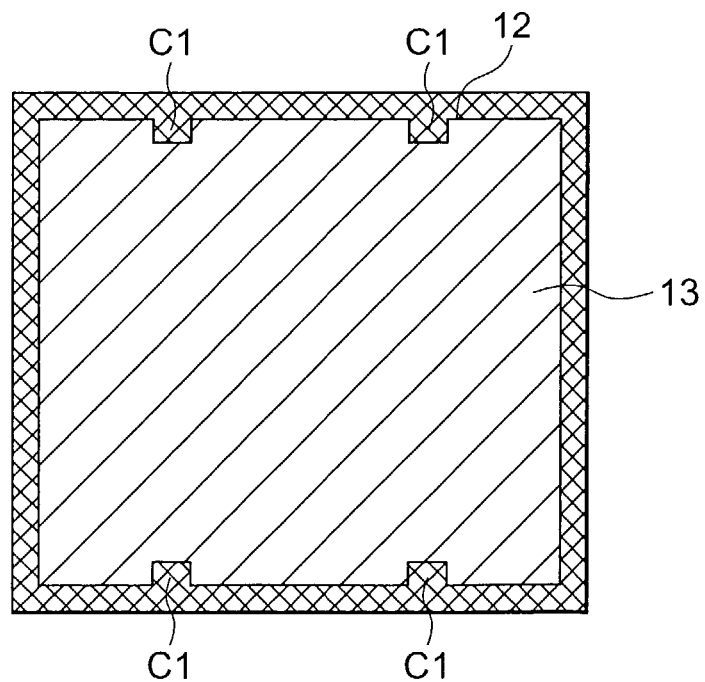
FIG. 21 shows a plan view for use in describing a mask blank manufactured by the use of the cover member illustrated in FIG. 20.

Referring to FIGS. 20 and 21, a cover member 30 and a photo-mask blank are illustrated, respectively, and are used for an electron beam drawer. In this connection, it is readily understood that the photo-mask blank shown in FIG. 21 is manufactured by the use of the cover member 30 shown in FIG. 20 and has a contact area contacted with an earth terminal of the electron beam drawer, a peripheral area around the contact area, and a circumferential portion from which a resist film is removed.

The cover member 30 illustrated in FIG. 20 has solvent supply members 38a to 38d which are fitted to the cover member 30 and which are substantially equivalent to those illustrated in FIGS. 8A and 8B. Among them, the solvent supply member 38c and 38d placed on the left and the right sides in FIG. 20 have similar arrangement of the solvent supply holes. In other words, the solvent supply holes are located at similar positions in the solvent supply members 38c and 38d. On the other hand, the solvent supply members 38*a* and 38*b* placed on the upper and the lower sides of FIG. 20 have solvent supply holes 31*a* for forming contact portions of the earth terminal and solvent supply holes 31*b* for forming removed portions other than the contact portions. As shown in FIG. 20, the solvent supply holes 31*a* are shifted from the solvent supply holes 31*b* inwardly of the cover member 30.

The photo-mask blank 13 illustrated in FIG. 21 is obtained by removing useless portions by the use of the cover member 30.

As shown in FIG. 21, the photo-mask blank has four earth contact portions C1 contacted with the earth terminal of the electron beam drawer and their adjacent areas from which the resist film is removed. Thus, the resist film is removed from the useless portions so as to prevent occurrence of dust. In the illustrated example, each removed width of the earth contact portions and another removed width of the adjacent areas are equal to 3.5 mm and 2.0 mm, respectively, from the substrate side surface.

Inasmuch as the resist film is removed from each earth contact portion and its adjacent area, no friction takes place between the resist film and each earth terminal of the electron beam drawer when the illustrated photo-mask blank is mounted on the electron beam drawer. As a result, the photo-mask blank causes neither dust nor a charge up phenomenon to occur due to the friction. Therefore, a mask can be attained without any displacement due to the charge up phenomenon and is very excellent in characteristics. This is because the photo-mask blank can be accurately positioned on the electron beam drawer.

In the above-mentioned embodiment, the bottom portion of the fitting groove 37 has a large number of holes 39 smaller in diameter than the solvent supply holes 31. However, this invention is not restricted to this structure. For example, the holes 39 may have diameters greater than the solvent supply holes 31 or may form slits. Briefly, the bottom portion having the holes 39 may have a mechanical strength necessary to associate the cover member with the side portion 35 and may stably guide the solvent onto the useless film without being influenced by the holes 39 even when the solvent supply holes 31 of the solvent supply member 38 are changed in size and/or in position. In consequence, the holes 39 may have optional configurations if stable supply of the solvent can be accomplished. The holes 39 may be placed on a ceiling portion of the cover member and the solvent supply member 38 is fitted to the ceiling portion from beneath.

The main body of the cover member 30 and the side portion 35 are associated with each other on the bottom portion of the fitting groove 37 having a lot of holes. But, this invention is not restricted to this structure. For example, the main body of the cover member may be coupled to the side portion 35 by extending a plurality of arms of arch shapes from the main body of the cover member to the side portion 35. In this event, each arm should be extended so that the supply of the solvent can not be adversely affected by the arms.

The illustrate solvent supply member is constituted by four members that can be exchanged at every side and that can be separated from one another but may be formed by a single member of a frame shape that can be exchanged only one time. Alternatively, the solvent supply member may be formed by members exchangeable for a predetermined area or for every solvent supply hole. The solvent supply member 38 may be totally or partially exchanged in consideration of the widths and the positions of the removed portions.

As the solvent for dissolving the resist, MCA (methyl cellulose acetate) has been used but any other solvents may be used if they can dissolve and remove the resist. When the useless portion of the resist film is removed by exposing the useless portion of the resist and by developing the same, a developer can be used as the solvent. In addition, the resin threads have been used as a gap spacer but may be replaced by any other threads having flexibility and withstanding the solvent. The gap spacer may not be restricted to threads but may be provided by convex portions formed on the inner wall of the cover member so as to maintain the gap.

The cover member may be formed by a material that has a weak heat transfer characteristic, a resistance characteristic against the solvent, and a desired mechanical strength. Practically, the material of the cover member may be, for example, a resin material, a glass material, a ceramic material, and their composite material. Among others, the resin material is preferable on account of a weak heat transfer, a good workability, and a light weight. The cover member may have preferably areas which are formed by the above-mentioned material and which cover the center region of the substrate surface.

In the above embodiments, the resist film is coated on the light-shielding film. However, this invention can be also applied to the case where an SOG film is coated on a transparent base and a light-shielding film is patterned on the SOG film. In this event, a transparent conductor film, an etching stopper film, and so on may be deposited on the light-shielding film.

Furthermore, this invention is also applicable to removing a protection film coated on a magnetic disk medium, a useless film formed on coating a protection film of a color filter, or an insulating film formed on electrodes wired on a display substrate. When the useless film is composed of a resist, the solvent may be a liquid, such as ketone, ester, aromatic hydrocarbon, hydrogen hydrocarbon, ether, or the like each of which can dissolve the resist.

When the useless film is formed by the SOG film, it is to be noted that the SOG film is hard to dissolve after baking and may therefore be preferably removed on the back, the side, and the circumferential surfaces of the substrate before baking. However, there is the resist that is soluble after baking in dependency upon its species. The positions of the solvent supply holes 31 may not be restricted to the positions illustrated in the embodiments.

The substrate 10 and the cover member 30 have to be rotated together in the above-mentioned embodiments but may not be always rotated. However, it is preferable that the solvent can be uniformly spread quickly through the gaps when rotation is done. In the above embodiments, the circumferential portions formed on the substrate of the square shape are removed to leave the square shape of the coating film. The shapes of the substrate and the remaining coating film may not be restricted to the square shape but may be a circular shape, a triangular shape, or a polygonal shape, or any other configuration. In this case, the cover member 30 may not be of a square shape but may have a configuration corresponding to a solvent supply surface and a non-supply surface.

According to this invention, it is possible to manufacture the mask blank that copes with user's specifications by leaving the removed film in response to the user's request. Especially, it is possible to avoid occurrence of a defective pattern in the supplementary patterns by controlling a removed area for the supplementary patterns and to suppress occurrence of dust resulting from separation of the resist film on the substrate circumferential portions.

When the removed areas of the film, such as the resist film are adjusted in consideration of the substrate support regions of the substrate, the reticle can be accurately positioned on an exposure device. On positioning the reticle, no separation of the resist film takes place and enables to suppress occurrence of dust. In addition, when the identification pattern, such as the barcode pattern, the identification symbols, is attached to the mask blank, each mask blank can be distinguished from one another directly.

According to the useless film removing method of this invention, removed areas of a film formed on the circumferential portions of the substrate can be accurately controlled in consideration of user's specifications and requests. This shows that the useless film can be removed in an optimum shape in response to the user's request.

According to the useless film removing apparatus, a useless film is removed in an optimum shape by attaching, to the cover member, to the adjusting means for adjusting the amounts and/or the supply positions of the solvent supplied to the useless portion. In addition, this invention provides the method of manufacturing the mask blank which has partially removed portions along a circumferential portion. The method of manufacturing the mask according to this invention makes it possible to manufacture the mask, such as the reticle, the photo-mask, that has no defective pattern in the identification patterns and that can be precisely positioned when it is held by an exposure device.

What is claimed is:

1. A mask blank, comprising:
    a base;
    a thin film on the base;
    a resist film, which has a center portion to be subsequently patterned and a circumferential portion surrounding the center portion, wherein
    the resist film is present on the center portion without being patterned;
    the resist film is present selectively on both a specific area of the circumferential portion and peripheral areas adjacent to the specific area of the circumferential portion; and
    the resist film is selectively removed from any areas of the circumferential portion other than the specific area and the peripheral areas of the circumferential portion.

2. A mask blank, comprising:
    a base;
    a thin film on the base; and
    a resist film which has a center portion to be subsequently patterned and a circumferential portion surrounding the center portion, wherein
        the resist film is present on the center portion without being patterned;
        the resist film is present on a supplementary pattern area of the circumferential portion; the supplementary pattern area having a supplementary pattern formed on the thin film as a combination of (1) areas where the resist film remains on the supplementary pattern area and (2) areas where the resist film is selectively removed; and
        the resist film is absent from peripheral areas of the circumferential portion.

3. A mask blank, comprising:
    a base;
    a thin film on the base; and
    an additional film on the thin film;
        the additional film having a circumferential portion surrounding a center portion, wherein
        the additional film is present on the center portion without being patterned;
        the additional film is partially and selectively removed from the circumferential portion, forming an identification pattern on the circumferential portion to identify the mask blank.

4. A mask blank as claimed in claim 3, wherein the identification pattern is specified by a barcode pattern.

5. A mask blank as claimed in claim 3, wherein the additional film is composed of a resist film.

6. A mask blank as claimed in claim 5, wherein the resist film is left only at an area of the identification pattern with the remaining area removed from the substrate peripheral portion.

7. A mask blank as claimed in claim 1, the mask blank being a photomask blank which comprises a transparent substrate, a thin film having a light shielding function, and a resist film.

8. A method of manufacturing a mask blank comprising:
    performing a film forming process of forming a transfer pattern film to be transferred into a transfer pattern and forming at least a resist film, and:
    removing a useless film from the films formed by said film forming process, by using the following steps:
        covering the surface of a substrate having such useless film with a cover member having a solvent path at a peripheral angle;
        supplying the solvent over the cover member to the useless portion though the solvent path so as to remove the useless portion by the solvent; and
        adjusting a supply amount and/or a supply position of the solvent fed though the solvent path to the useless portion to form a pattern on a circumferential portion of the substrate.

9. A method of manufacturing a mask from the mask blank obtained by the method claimed in claim 8, comprising the step of:
    patterning the films into a transfer pattern.

10. A method of forming a fine pattern on a substrate by a photolithography technique, comprising the steps of:
    preparing the mask claimed in claim 9; and
    transferring the fine pattern by the use of the mask.

11. A mask blank manufactured by the method claimed in claim 8 and comprising:
    a thin film for providing the transfer pattern on the substrate; and
    a resist film having a circumferential portion that is left on the substrate at a support area to be supported by a holder used in an exposure apparatus and its peripheral area and that is removed from any other areas than the support and the peripheral areas.

12. A mask blank manufactured by the method claimed in claim 8 and comprising:
    a thin film for providing the transfer pattern and a supplementary pattern on the substrate;
    a resist film having a circumferential portion that is left on the substrate at a supplementary pattern area for the supplementary pattern and its peripheral area and that is removed from any other useless area than the supplementary pattern area and its peripheral area.

13. A mask blank manufactured by the method claimed in claim 8 and comprising:
    a thin film for providing the transfer pattern on the substrate;
    an additional film;
    the additional film having a circumferential portion which is left on a substrate peripheral portion and which is partially removed to form an identification pattern to identify the mask blank but not to identify the transfer mask.

14. A mask blank which is used as an original plate of a transfer mask having a transfer pattern on a substrate, comprising:
   a thin film for providing the transfer pattern on the substrate;
   an additional film; and
   an identification pattern which specifies at least one of a mask blank specification, a type, a product number, and a defect degree data, said identification pattern being formed by at least one of the additional film and the thin film.

15. A mask blank as claimed in claim 14, wherein the identification pattern is formed by a barcode pattern.

16. A mask blank as claimed in claim 3 or 14, wherein the identification pattern is pattern-recognized by using reflection between the additional film and the thin film underlying the additional film or by using reflection between the resist film and/or the thin film and the substrate.

17. A mask blank as claimed in claim 14, wherein the identification pattern is pattern-recognized by using reflection between the additional film and the thin film underlying the additional film or by using reflection between the resist film and/or the thin film and the substrate.

18. A mask blank as claimed in claim 3, wherein the identification pattern includes defect degree data of the mask blank.

19. A mask blank as claimed in claim 3, wherein the additional film is a resist film.

20. A mask blank which is used as an original plate of a transfer mask having a transfer pattern on a substrate, comprising:
   a thin film for providing the transfer pattern and a pattern of defect degree data on the substrate;
   a resist film having a circumferential portion that is left on the substrate at a defect degree data area for the pattern of the defect degree data and its peripheral area, said resist film being removed from any other useless area than the defect degree data area and its peripheral area.

* * * * *